(12) United States Patent
Hammond et al.

(10) Patent No.: US 10,803,401 B2
(45) Date of Patent: Oct. 13, 2020

(54) ARTIFICIAL INTELLIGENCE ENGINE HAVING MULTIPLE INDEPENDENT PROCESSES ON A CLOUD BASED PLATFORM CONFIGURED TO SCALE

(71) Applicant: Microsoft Technology Licensing, LLC, Redmond, WA (US)

(72) Inventors: Mark Isaac Hammond, Berkeley, CA (US); Keen McEwan Browne, Berkeley, CA (US); Shane Arney, Richmond, CA (US); Matthew Haigh, Seattle, WA (US); Jett Evan Jones, Seattle, WA (US); Matthew James Brown, San Francisco, CA (US); Ruofan Kong, Berkeley, CA (US); Chetan Desh, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 740 days.

(21) Appl. No.: 15/417,086

(22) Filed: Jan. 26, 2017

(65) Prior Publication Data
US 2017/0213156 A1    Jul. 27, 2017

Related U.S. Application Data

(60) Provisional application No. 62/287,861, filed on Jan. 27, 2016.

(51) Int. Cl.
*G06N 3/04* (2006.01)
*G06N 3/08* (2006.01)
(Continued)

(52) U.S. Cl.
CPC .......... *G06N 20/00* (2019.01); *G06F 3/0482* (2013.01); *G06F 8/31* (2013.01); *G06F 8/38* (2013.01);
(Continued)

(58) Field of Classification Search
CPC .......... G06N 3/04; G06N 3/0454; G06N 3/08; G06N 3/105; G06N 5/04; G06Q 10/00;
(Continued)

(56) References Cited

U.S. PATENT DOCUMENTS

| 5,619,618 | A  | 4/1997 | Bigus  |
| 6,449,603 | B1 | 9/2002 | Hunter |

(Continued)

FOREIGN PATENT DOCUMENTS

WO   WO 2015/017706   2/2015

OTHER PUBLICATIONS

Cross-Reference to Related Applications Under 37 C.F.R. 1.78, 2 pages.
(Continued)

*Primary Examiner* — Austin Hicks
(74) *Attorney, Agent, or Firm* — Alleman Hall Creasman & Tuttle LLP

(57) ABSTRACT

The multiple independent processes run in an AI engine on its cloud-based platform. The multiple independent processes are configured as an independent process wrapped in its own container so that multiple instances of the same processes can run simultaneously to scale to handle one or more users to perform actions. The actions to solve AI problems can include 1) running multiple training sessions on two or more AI models at the same time, 2) creating two or more AI models at the same time, 3) running a training session on one or more AI models while creating one or more AI models at the same time, 4) deploying and using two or more trained AI models to do predictions on data from one or more data sources, 5) etc. A service handles scaling by dynamically calling in additional computing devices to load on and run additional instances of one or more of the independent processes as needed.

20 Claims, 10 Drawing Sheets

Figure 1A:
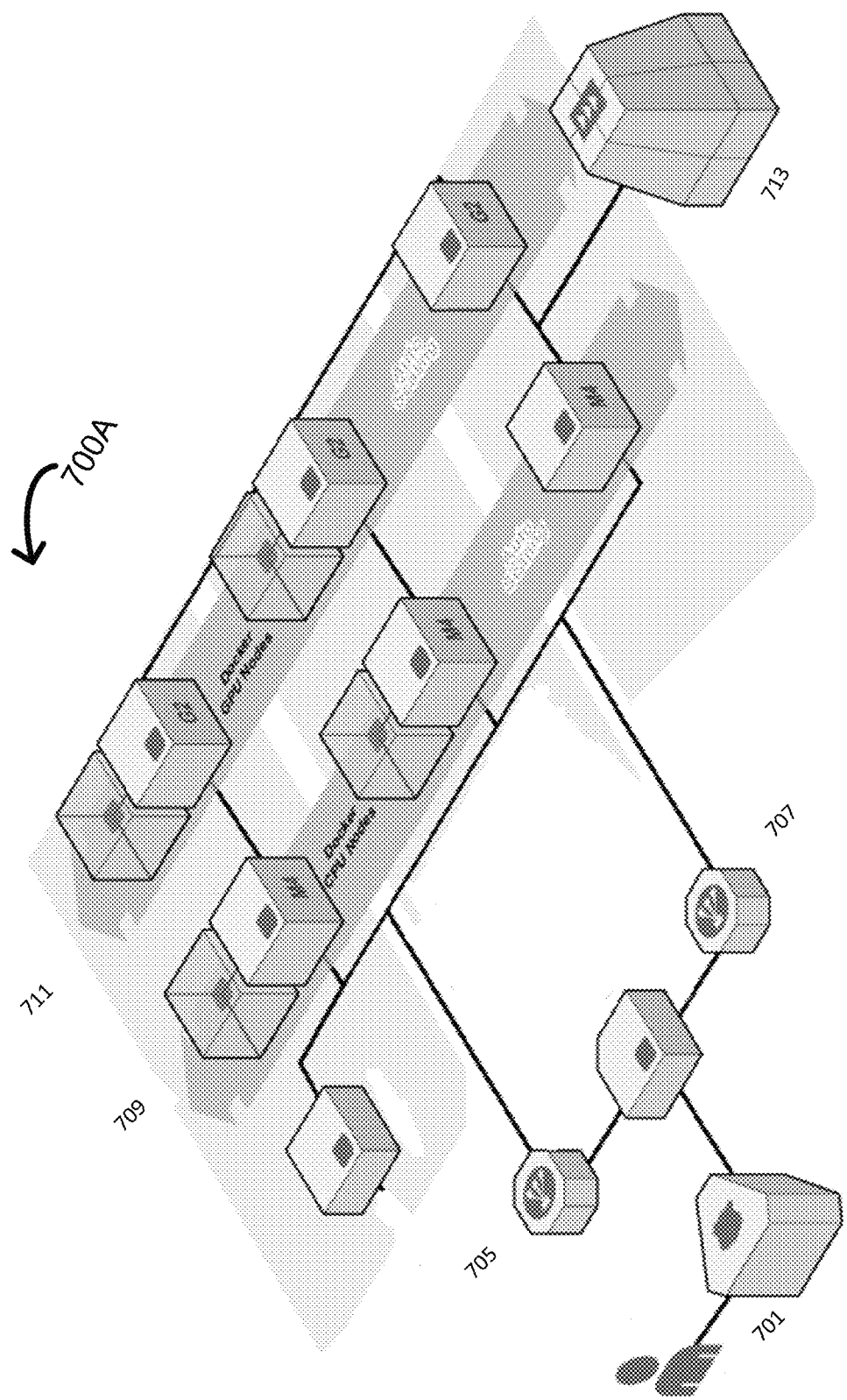

(51) Int. Cl.

| | | |
|---|---|---|
| *G06N 20/00* | (2019.01) | |
| *G06F 16/951* | (2019.01) | |
| *G06F 16/22* | (2019.01) | |
| *G06F 8/38* | (2018.01) | |
| *G06Q 10/00* | (2012.01) | |
| *G06N 3/10* | (2006.01) | |
| *G06F 30/20* | (2020.01) | |
| *G06F 8/30* | (2018.01) | |
| *H04L 29/06* | (2006.01) | |
| *G06F 9/451* | (2018.01) | |
| *G06F 3/0482* | (2013.01) | |
| *G06N 3/00* | (2006.01) | |
| *G06N 5/04* | (2006.01) | |
| *G06F 9/48* | (2006.01) | |
| *G06F 15/80* | (2006.01) | |
| *G06K 9/62* | (2006.01) | |
| G06F 30/333 | (2020.01) | |
| G06F 40/166 | (2020.01) | |
| G06F 3/0354 | (2013.01) | |

(52) U.S. Cl.
 CPC ............ *G06F 9/451* (2018.02); *G06F 9/4881* (2013.01); *G06F 15/80* (2013.01); *G06F 16/2228* (2019.01); *G06F 16/951* (2019.01); *G06F 30/20* (2020.01); *G06K 9/6257* (2013.01); *G06N 3/008* (2013.01); *G06N 3/04* (2013.01); *G06N 3/0454* (2013.01); *G06N 3/08* (2013.01); *G06N 3/105* (2013.01); *G06N 5/04* (2013.01); *G06Q 10/00* (2013.01); *H04L 67/42* (2013.01); *G06F 3/03543* (2013.01); *G06F 30/333* (2020.01); *G06F 40/166* (2020.01)

(58) Field of Classification Search
 CPC ..... H04L 67/42; G06F 3/03543; G06F 17/24; G06F 2217/14
 See application file for complete search history.

(56) References Cited

U.S. PATENT DOCUMENTS

| | | | |
|---|---|---|---|
| 8,521,664 | B1 | 8/2013 | Lin et al. |
| 9,443,192 | B1 | 9/2016 | Cosic |
| 9,460,088 | B1 | 10/2016 | Sak et al. |
| 2005/0034109 | A1 | 2/2005 | Hamilton et al. |
| 2005/0114280 | A1 | 5/2005 | Rising, III |
| 2005/0132032 | A1 | 6/2005 | Bertrand |
| 2005/0197991 | A1 | 9/2005 | Wray et al. |
| 2006/0166174 | A1 | 7/2006 | Rowe et al. |
| 2006/0218107 | A1 | 9/2006 | Young |
| 2009/0106165 | A1 | 4/2009 | Solomon |
| 2009/0106178 | A1 | 4/2009 | Chu |
| 2009/0204563 | A1 | 8/2009 | Gerber et al. |
| 2010/0088258 | A1 | 4/2010 | Oaten et al. |
| 2010/0094790 | A1* | 4/2010 | Gnojewski ............ G06N 3/084 706/25 |
| 2010/0106714 | A1 | 4/2010 | Lim et al. |
| 2012/0159090 | A1* | 6/2012 | Andrews ................ G06T 1/20 711/153 |
| 2012/0209794 | A1 | 8/2012 | Jones, III |
| 2012/0239598 | A1 | 9/2012 | Cascaval et al. |
| 2015/0066929 | A1 | 3/2015 | Satzke et al. |
| 2015/0339570 | A1 | 11/2015 | Scheffler |
| 2016/0034809 | A1* | 2/2016 | Trenholm ........... H04L 41/5041 706/20 |
| 2016/0283202 | A1 | 9/2016 | Sellers-blais |
| 2017/0091670 | A1 | 3/2017 | Gulin et al. |
| 2017/0213126 | A1 | 7/2017 | Hammond et al. |
| 2017/0213128 | A1 | 7/2017 | Hammond et al. |
| 2017/0213131 | A1 | 7/2017 | Hammond et al. |
| 2017/0213132 | A1 | 7/2017 | Hammond et al. |
| 2017/0213154 | A1 | 7/2017 | Hammond et al. |
| 2017/0213155 | A1 | 7/2017 | Hammond et al. |
| 2017/0308800 | A1 | 10/2017 | Cichon et al. |
| 2018/0293463 | A1 | 10/2018 | Brown |
| 2018/0293498 | A1 | 10/2018 | Campos et al. |
| 2018/0293517 | A1 | 10/2018 | Browne et al. |
| 2018/0307945 | A1 | 10/2018 | Haigh et al. |
| 2018/0357047 | A1 | 12/2018 | Brown et al. |
| 2018/0357152 | A1 | 12/2018 | Browne et al. |
| 2018/0357543 | A1 | 12/2018 | Brown et al. |
| 2018/0357552 | A1 | 12/2018 | Campos et al. |

OTHER PUBLICATIONS

Bonsai AI, Inc. Services Overview, 3 pages.
Chung, Kiuk, "Generating Recommendations at Amazon Scale with Apache Spark and Amazon DSSTNE", AWS Big Data Blog, Jul. 9, 2016, 10 pages.
Dunn, Jeffrey, "Introducing FBLearner Flow: Facebook's AI backbone", Engineering Blog, Facebook Code, Dec. 20, 2016, 11 pages.
Gray, Kathryn E., "Towards Customizable Pedagogic Programming Languages", dissertation submitted to the School of Computing at the University of Utah, Aug. 2006, 156 pages.
Hammond, Mark et al. "AI for Everyone: An Introduction to Bonsai BRAIN and Inkling" Bonsai AI, Inc. Whitepaper, 2016, 16 pages.
He, Jinru, "Auto scaling Pinterest" Pinterest Engineering Blog, Sep. 16, 2016, 7 pages.
Ma, Kevin, "Applying deep learning to Related Pins" Pinterest Engineering Blog, Jan. 12, 2017, 8 pages.
Raschka, Sebastian, "Fitting a model via closed-form equations vs. Gradient Descent vs Stochastic Gradient Descent vs Mini-Batch Learning. What is the difference?" Machine Learning FAQ, Jan. 17, 2017, 6 pgs.
SuperUser.Com, "What's the difference between an Application, Process, and Services?" Jan. 20, 2017, 1 page.
Tessler, Chen et al., "A Deep Hierarchical Approach to Lifelong Learning in Minecraft" Technion Israel Institute of Technology, Nov. 30, 2016, 10 pages.
www.docker, "Build, Ship, Run Any App, Anywhere", https://dockercon.smarteventscloud.com/portal/newreg.ww DockerCon 2017, 7 pages.
International Search Report and Written Opinion for International Application PCT/US2017/015446 dated Apr. 10, 2017, 6 pages.
International Search Report and Written Opinion for International Application PCT/US2017/015460 dated May 5, 2017, 11 pages.
International Search Report and Written Opinion for International Application PCT/US2017/015470 dated Apr. 21, 2017, 11 pages.
Campos, et al., "Concept Network Reinforcement Learning for Flexible Dexterous Manipulation", Retrieved From: https://medium.com/@BonsaiAI/concept-network-reinforcement-learning-for-flexible-dexterous-manipulation-47bf459b19b9, Sep. 19, 2017, 11 Pages.
Gudimella, et al., "Deep Reinforcement Learning for Dexterous Manipulation With Concept Networks", Retrieved From: https://arxiv.org/pdf/1709.06977.pdf, Sep. 20, 2017, 16 Pages.
Hengst, Bernhard, "Safe State Abstraction and Reusable Continuing Subtasks in Hierarchical Reinforcement Learning", In Proceedings of 20th Joint Conference on Artificial Intelligence, Dec. 2, 2007, 11 Pages.
"International Search Report & Written Opinion Issued in PCT Application No. PCT/US2018/037650", dated Aug. 31, 2018, 10 Pages.
"Non Final Office Action Issued in U.S. Appl. No. 15/416,988", dated Oct. 3, 2019, 11 Pages.
"Non Final Office Action Issued in U.S. Appl. No. 15/417,056", dated Oct. 17, 2019, 10 Pages.
Beale, et al., "Neural Network Toolbox 7 User's Guide", Retrieved from http://citeseerx.ist.psu.edu/viewdoc/download?doi=10.1.1.220.1640&rep=rep1&type=pdf, 2010, 951 Pages.
"Non-Final Office Action Issued in U.S. Appl. 15/416,904", dated Aug. 14, 2019, 11 Pages.
"Notice of Allowance Issued in U.S. Appl. No. 15/417,075", dated Aug. 14, 2019, 9 Pages.

(56) References Cited

OTHER PUBLICATIONS

"Extended Search Report Issued in European Patent Application No. 17745025.1", dated Aug. 23, 2019, 9 Pages.
"Extended Search Report Issued in European Patent Application No. 17745016.0", dated Aug. 20, 2019, 8 Pages.
"Extended Search Report Issued in European Patent Application No. 17745030.1", dated Sep. 2, 2019, 7 Pages.
"Final Office Action Issued in U.S. Appl. No. 15/416,970", dated Mar. 3, 2020, 7 Pages.
"Non Final Office Action Issued in U.S. Appl. No. 15/416,970", dated Nov. 21, 2019, 12 Pages.
"Non Final Office Action Issued in U.S. Appl. No. 15/417,033", dated Nov. 26, 2019, 13 Pages.
"Office Action Issued in European Patent Application No. 17745016.0", dated Jul. 13, 2020, 9 Pages.
Lirov, Yuval, "Computer Aided Neural Network Engineering", In the Journal of Neural Networks, vol. 5, Issue 4, Jul. 1992, pp. 711-719.
Perera, et al., "ANNEbot: An Evolutionary Artificial Neural Network Framework", In the Proceedings of 4th International Conference on Intelligent and Advanced Systems, Jun. 12, 2012, pp. 40-45.

* cited by examiner

```
                              ┌─────────┐
                              │  Start  │
                              └────┬────┘
                                   ▼
```

| Multiple independent processes carry out four or more separate tasks by 1) interaction with and 2) cooperation between the multiple independent processes. Also, Instances of the independent processes can be wrapped into a software container to allow each instance of that independent process to be loaded onto and then run independently on whatever computing device, such as a CPU or GPU, that instance is running on. <u>100</u> |
|---|

| Multiple independent processes are run in an AI engine on a cloud-based platform, where the multiple independent processes are configured as an independent process wrapped in its own container so that multiple instances of the same processes can run simultaneously to scale to handle the one or more users to perform actions to solve AI problems. The actions to solve AI problems can include 1) running multiple training sessions on two or more AI models at the same time, 2) creating two or more AI models at the same time, 3) running a training session on one or more AI models while creating one or more AI models at the same time, 4) deploying two or more trained AI models and using the trained AI models to do predictions on data from one or more data sources, and 5) any combination of these four, on the same AI engine. <u>102</u> |
|---|

| An engineer service and/or conduct service of the independent processes is configured to handle scaling by dynamically calling in additional computing devices to load on and run additional instances of one or more of the independent processes wrapped in its own container as needed. <u>104</u> |
|---|

| Multiple independent processes carry out a first task of creating a shell of an AI model. <u>110</u> |
|---|

| Multiple independent processes carry out a second task of loading in a file of scripted code in the pedagogical software programming language to help define 1) a topology of processing nodes in the AI model, 2) a layout of the concepts making up the AI model, 3) a selection of an appropriate learning algorithm for the AI model, and 4) other similar details in order to flesh out the details of the AI model and then instantiate the AI model. <u>120</u> |
|---|

Fig. 4A                    ( Cont. )

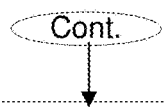

Multiple independent processes carry out a third task of starting to train the AI model with some sort of data source, such as a simulator, according to a lesson plan and curriculum.
130

The independent processes include a watchman service configured to monitor to see if any of 1) when failures occur in any of the other independent processes and 2) when any of the other independent processes exit, and then to tell all of the independent processes that were participating in that training to exit the training session that they were cooperating in. Similarly, the watchman service can monitor deployment and use sessions with the trained AI model and/or AI model creation sessions to tell all of the independent processes that were participating in that AI event to exit when a failure occurs or when one of the other independent processes exit.
140

Multiple independent processes carry out a fourth task of deploying a trained AI model and using the trained AI model to do predictions and/or other actions on data from one or more data sources.
150

Fig. 4B  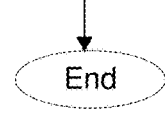

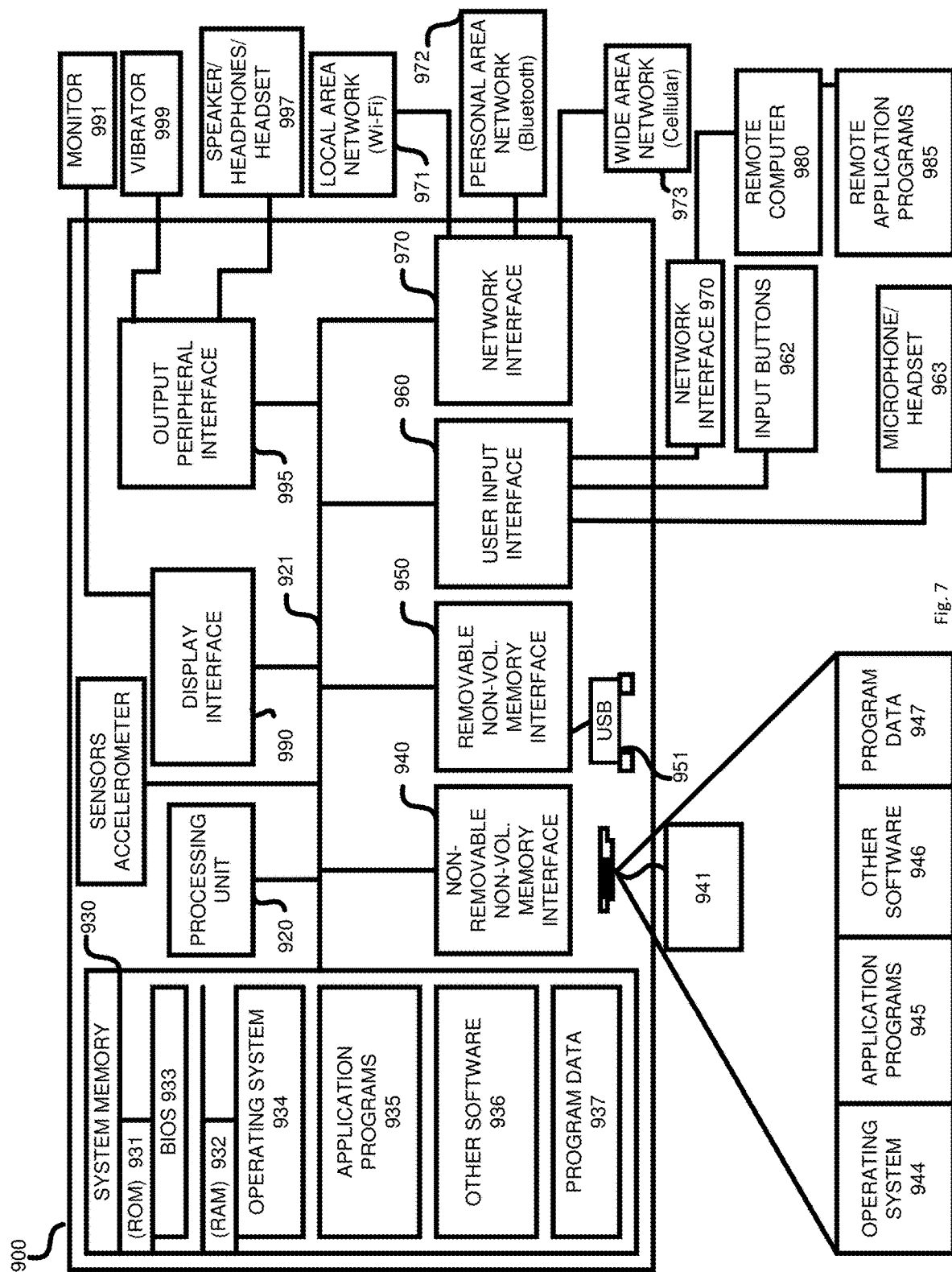

US 10,803,401 B2

ARTIFICIAL INTELLIGENCE ENGINE HAVING MULTIPLE INDEPENDENT PROCESSES ON A CLOUD BASED PLATFORM CONFIGURED TO SCALE

CROSS-REFERENCE

This application claims priority to U.S. Provisional Patent Application No. US 62/287,861, filed Jan. 27, 2016, titled "BONSAI PLATFORM, LANGUAGE, AND TOOLING," the disclosure of which is hereby incorporated herein by reference in its entirety.

NOTICE OF COPYRIGHT

A portion of this disclosure contains material that is subject to copyright protection. The copyright owner has no objection to the facsimile reproduction by anyone of the material subject to copyright protection as it appears in the United States Patent & Trademark Office's patent file or records, but otherwise reserves all copyright rights whatsoever.

FIELD

Embodiments of the design provided herein generally relate to artificial intelligence ("AI") systems having multiple independent processes on a cloud-based platform configured to scale.

BACKGROUND

An engineer may need to attempt hundreds of experiments before finding a successful new feature or set of hyper parameters. Traditional pipeline systems do not provide a way to rerun pipelines with different inputs, mechanisms to explicitly capture outputs and/or side effects, and visualization of outputs. Additionally, training artificial intelligence models can take days or even weeks. Sometimes multiple training sessions on an artificial intelligence engine may be desired while also being able to create new AI models and/or while utilizing trained AI models.

SUMMARY

Provided herein in are some embodiments on an AI engine hosted on cloud platform. In an embodiment, a method is discussed for the AI engine having multiple independent processes on a cloud-based platform. The multiple independent processes run in the AI engine on its cloud-based platform. The multiple independent processes are configured as an independent process wrapped in its own container so that multiple instances of the same processes can run simultaneously to scale to handle one or more users to perform actions to solve AI problems. The actions to solve AI problems can include 1) running multiple training sessions on two or more AI models at the same time, 2) creating two or more AI models at the same time, 3) running a training session on one or more AI models while creating one or more AI models at the same time, 4) deploying and using two or more trained AI models to do predictions on data from one or more data sources, and 5) any combination of these four. A first service handles scaling by dynamically calling in additional computing devices to load on and run additional instances of one or more of the independent processes as needed.

These and other features of the design provided herein can be better understood with reference to the drawings, description, and claims, all of which form the disclosure of this patent application.

DRAWINGS

The drawings refer to some embodiments of the design provided herein in which:

FIG. 1A provides a schematic illustrating an AI system in accordance with some embodiments.

Figure 1B:
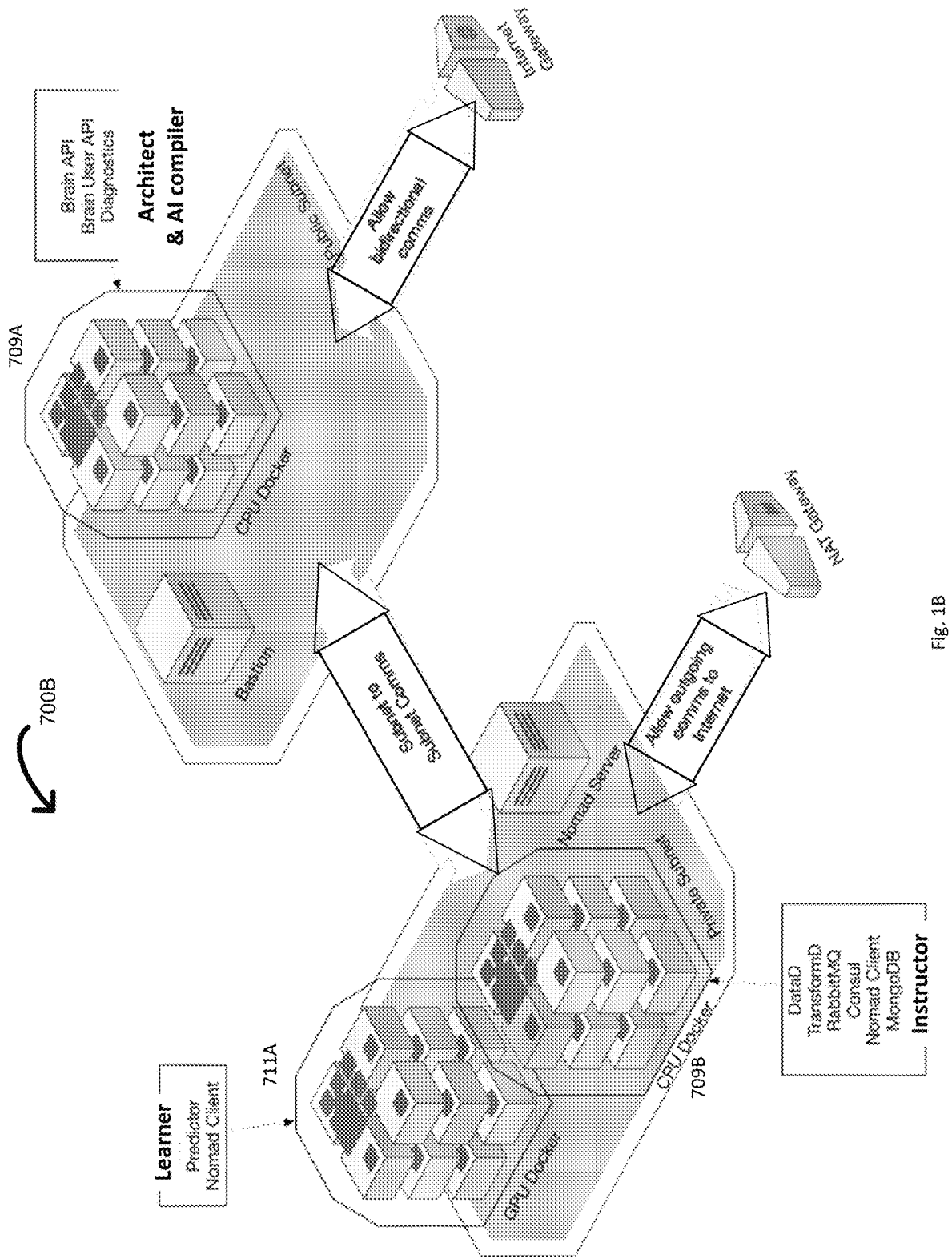

FIG. 1B provides a schematic illustrating an AI system in accordance with some embodiments.

Figure 2:
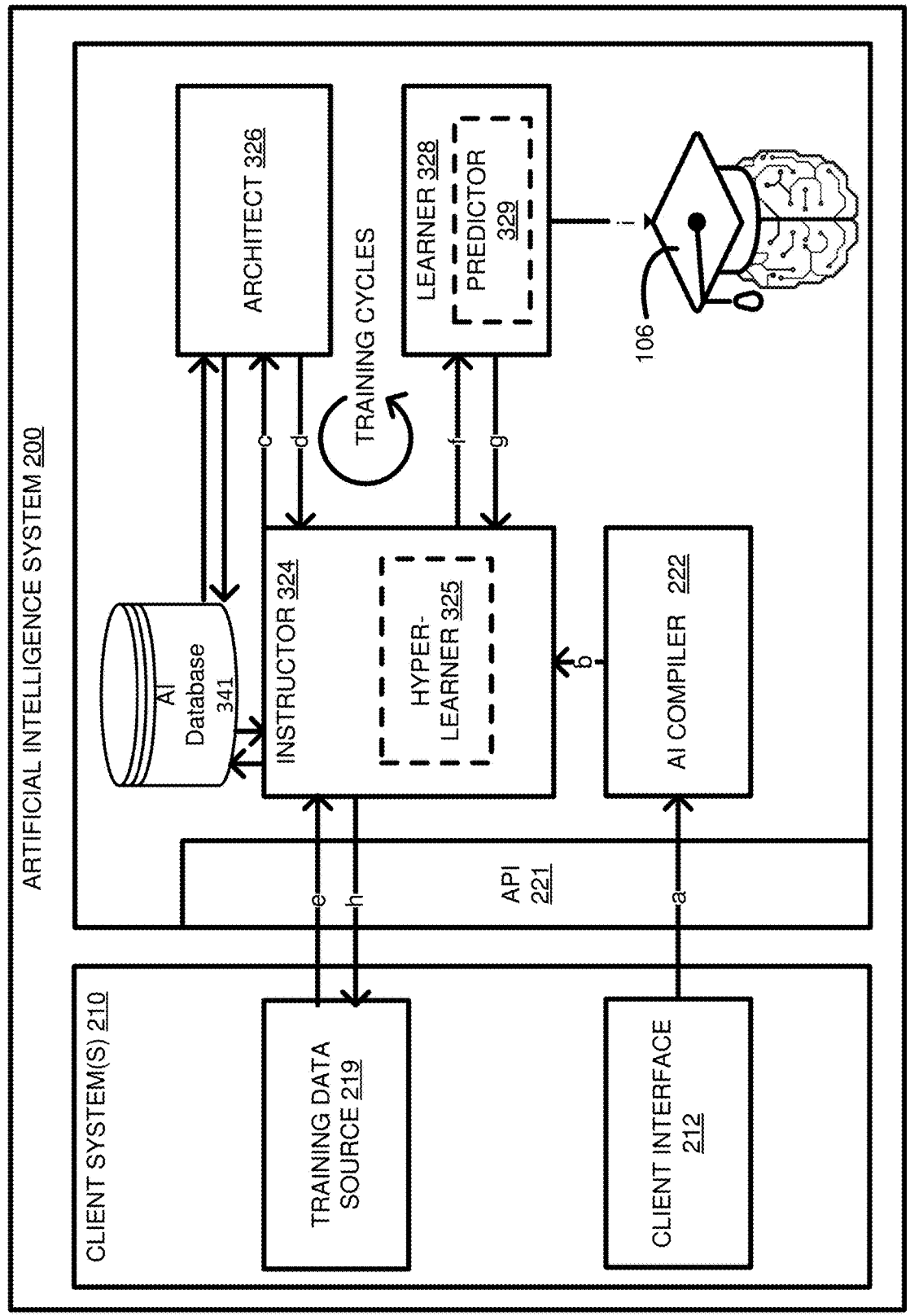

FIG. 2 provides a schematic illustrating an AI system in accordance with some embodiments.

Figure 3A:
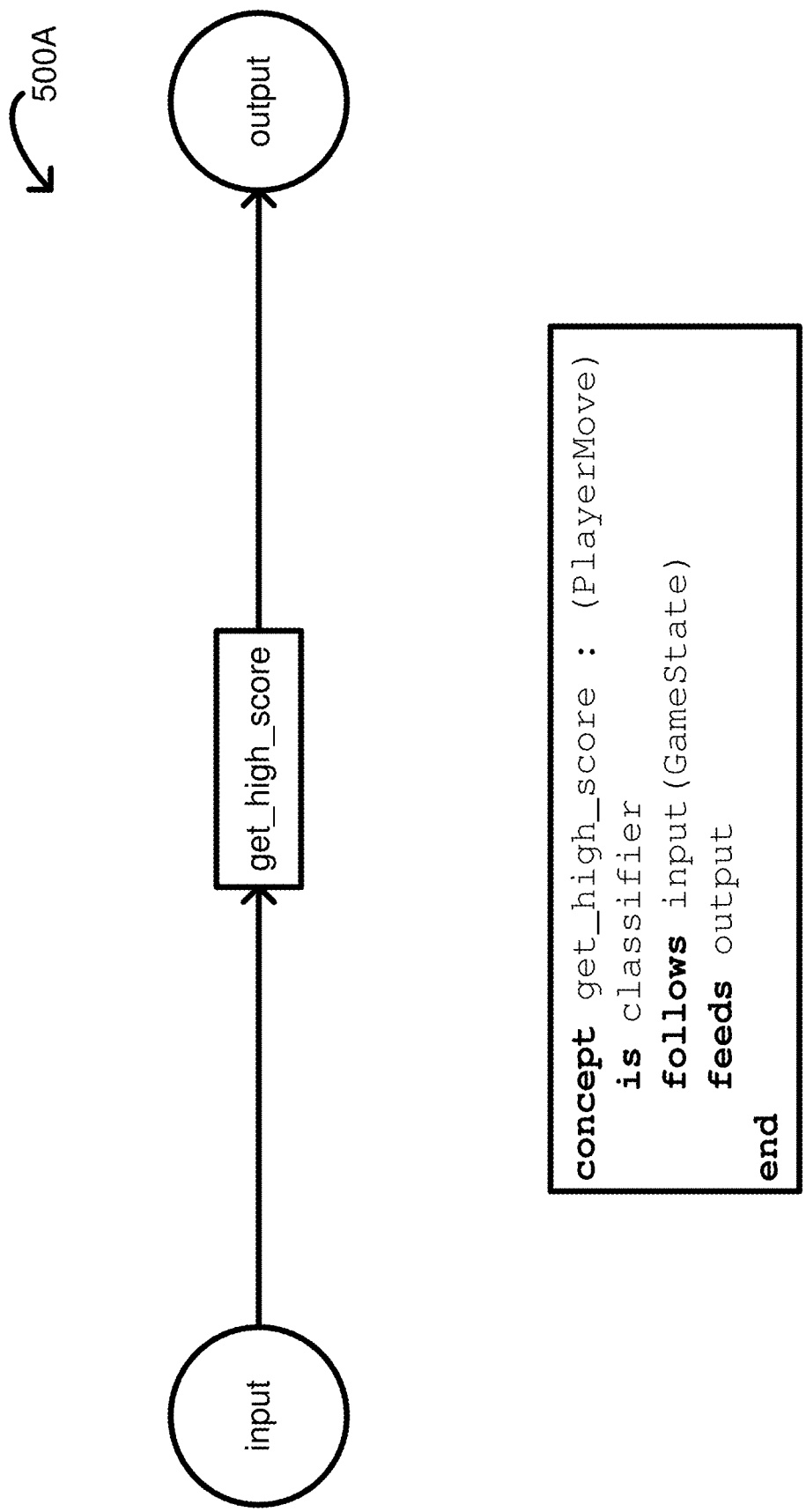

FIG. 3A provides a schematic illustrating a mental model in accordance with some embodiments.

Figure 3B:
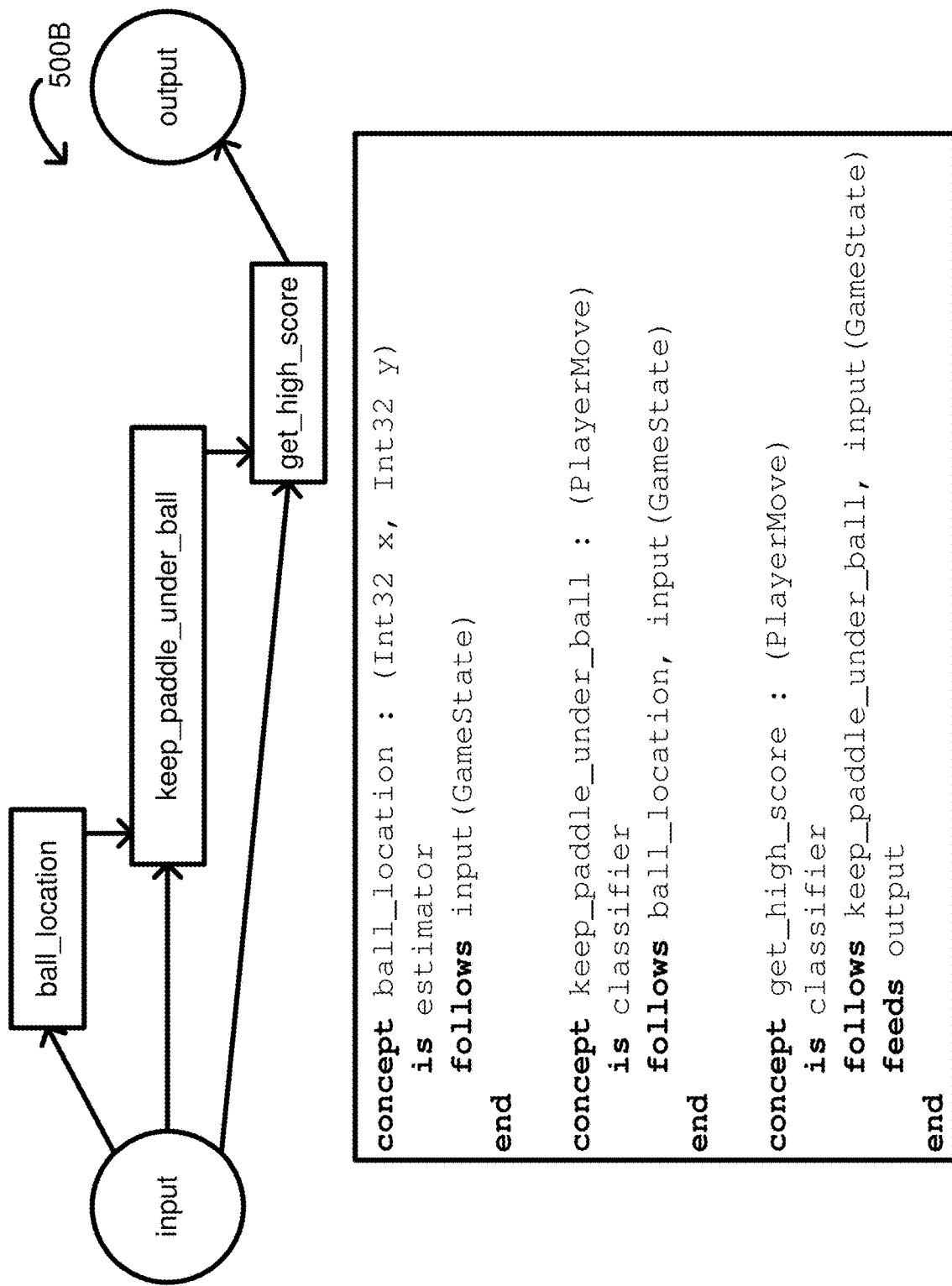

FIG. 3B provides a schematic illustrating a mental model in accordance with some embodiments.

FIGS. 4A-4B illustrate a flow diagram of an embodiment of multiple processes in AI engine cooperating with other components.

Figure 5:
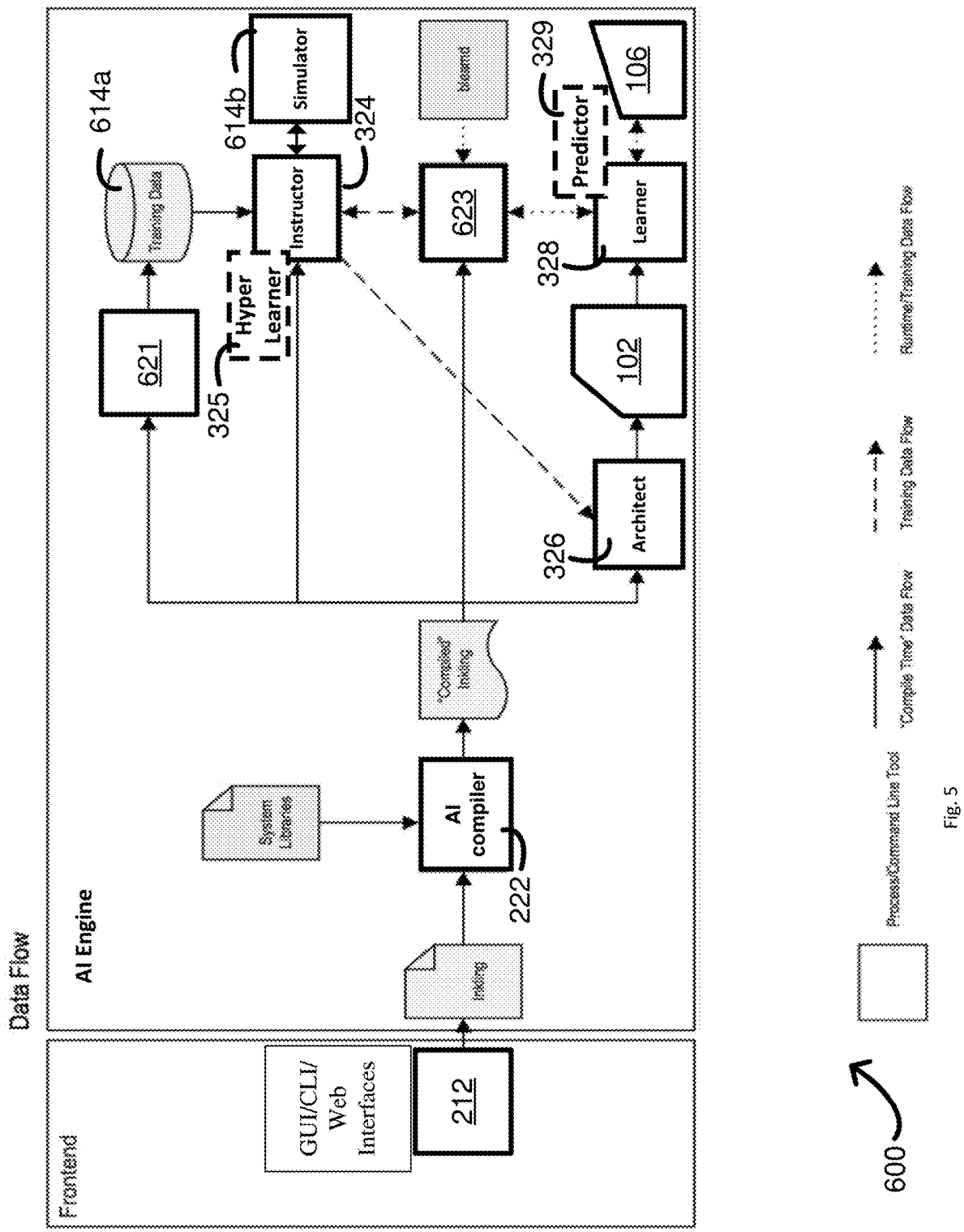

FIG. 5 provides a schematic illustrating an AI system in accordance with some embodiments.

Figure 6:
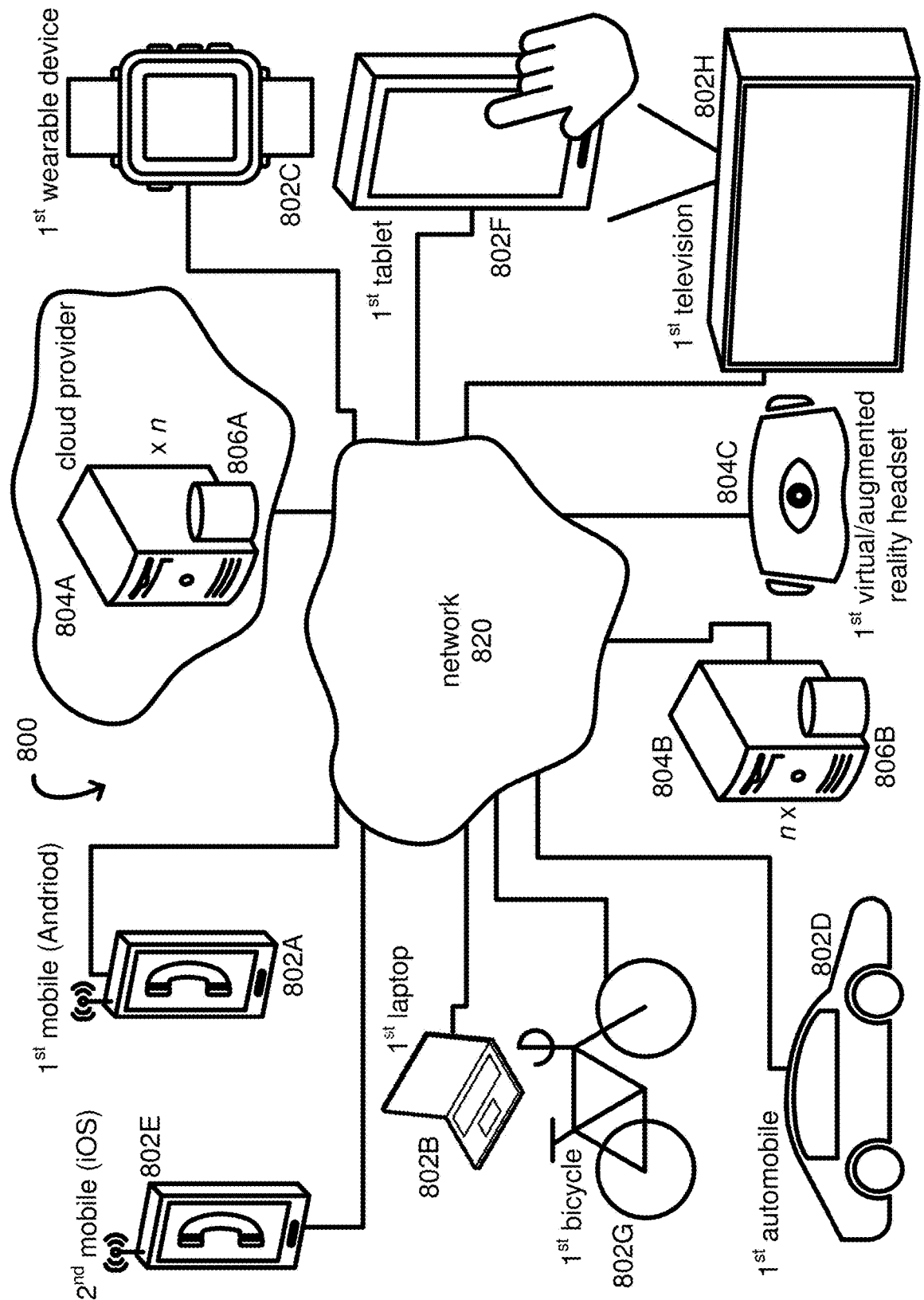

FIG. 6 provides one or more networks in accordance with some embodiments.

FIG. 7 provides one or more computing systems in accordance with some embodiments.

While the design is subject to various modifications, equivalents, and alternative forms, specific embodiments thereof have been shown by way of example in the drawings and will now be described in detail. It should be understood that the design is not limited to the particular embodiments disclosed, but—on the contrary—the intention is to cover all modifications, equivalents, and alternative forms using the specific embodiments.

DESCRIPTION

In the following description, numerous specific details are set forth, such as examples of specific data signals, named components, memory in a device, etc., in order to provide a thorough understanding of the present design. It will be apparent, however, to one of ordinary skill in the art that the present design can be practiced without these specific details. In other instances, well known components or methods have not been described in detail but rather in a block diagram in order to avoid unnecessarily obscuring the present design. Further, specific numeric references such as a first database, can be made. However, the specific numeric reference should not be interpreted as a literal sequential order but rather interpreted that the first database is different than a second database. Thus, the specific details set forth are merely exemplary. The specific details can be varied from and still be contemplated to be within the spirit and scope of the present design. The term coupled is defined as meaning connected either directly to the component or indirectly to the component through another component.

In general, an AI engine having multiple independent processes on a cloud-based platform is discussed. The multiple independent processes are configured as an independent process wrapped in its own container so that multiple instances of the same processes, (e.g.) learner process and instructor process, can run simultaneously to scale to handle one or more users to perform actions to solve AI problems. The actions to solve AI problems can include 1) running multiple training sessions on two or more AI models at the same time, 2) creating two or more AI models at the same time, 3) running a training session on one or more AI models while creating one or more AI models at the same time, 4) deploying and using two or more trained AI models to do predictions on data from one or more data sources, and 5) any combination of these four, on the same artificial intelligence engine. A service, such as an engineer service, of the independent processes is configured to handle scaling by dynamically calling in additional computing devices to load on and run additional instances of one or more of the independent processes wrapped in its own container, such as the learner process and/or instructor process, as needed to handle all of the users and their AI problems.

Backend Infrastructure

FIG. 1A provides a schematic illustrating an AI system 700A in accordance with some embodiments. A backend cloud platform can exist of various servers, processes, databases, and other components that connect over a network, such as the Internet, to a plurality of computing devices. The backend cloud platform is configured to handle the scaling, efficiency, etc.

In an embodiment, a user such as a software developer can interface with the AI system 700A through an online interface 701; however, the user is not limited to the online interface, and the online interface is not limited to that shown in FIG. 1A. An input may be supplied from an online API, such as www.bons.ai, a command line interface, and a graphic user interface such as Mastermind. With this in mind, the AI system 700A of FIG. 1A can enable a user to make API and web requests through a domain name system ("DNS") 701, which requests can be optionally filtered through a proxy to route the API requests to an API load balancer 705 and the web requests to a web load balancer 707. Alternatively, the proxy service may be part of a service running on a CPU computing device. The API load balancer 705 can be configured to distribute the API requests among multiple processes wrapped in their own containers running in a containerization platform, such as a Docker type network. The web load balancer 707 can be configured to distribute the web requests among the multiple processes wrapped in their own containers running in this containerization platform. The network can include a cluster of one or more central processing unit ("CPU") computing devices 709 and a cluster of one or more graphics processing unit ("GPU") computing devices 711. One or more service running in the network will scale more or less CPU computing devices 709 and GPU computing devices 711 as needed. The CPU computing devices 709 can be utilized for most independent processes running on the swarm network, and the GPU computing devices 711 can be utilized for the more computationally intensive independent processes such as TensorFlow and the learner process. Various services may run on either the CPU computing device 709 or in the GPU computing device 711, as capacity in that machine is available at the time.

As further shown in FIG. 1A, a logging stack, such as an Elastisearch-Logstash-Kibana ("ELK") stack cluster, 713 can be shared among all production clusters for dedicated monitoring and an indexing/logging.

The cloud-based platform with multiple independent processes is configured for the user to define the artificial intelligence problem to be solved. In an embodiment, all of the individual processes are wrapped into a container program such as a Docker™. The software container allows each instance of that independent process to run independently on whatever computing device that instance is running on.

A software process may be an instance of an executable file configured to perform a task in a finite amount of time i.e. a job. Thus, each process is configured to operate for a finite amount of time to achieve its configured goal and then shut down until invoked again when needed in the future. Several instances of a same process each wrapped in its own container may run simultaneously on one or more computing devices. A service may be a process, which runs in the background. Each independent process is configured to be aware of the existence of the other processes and knows whom to call and what data and types of inputs that other processes looking for.

The individual processes in the AI engine utilize a scaling hardware platform, such as Amazon Web Services, so that the individual processes of AI engine, the amount of Central Processing Units (CPUs), Graphics Processing Units (GPUs), and RAM may dynamically change overtime and rapidly change to scale to handle multiple users sending multiple AI models to be trained.

For example, an engineer service can be configured to dynamically change an amount of computing devices 709, 711 overtime running independent processes and to rapidly change the amount to scale to handle multiple users sending multiple AI models to be trained. A conductor service or an engineer service can cause a first instance of an instructor process to be instantiated, loaded onto a CPU computing device, and then run on a first CPU computing device 709.

The AI engine having multiple independent processes on a cloud-based platform, where the multiple independent processes are configured as an independent process wrapped in its own container so that multiple instances of the same processes, e.g. learner process and instructor process, can run simultaneously to scale to handle one or more users to perform actions selected from a group consisting of 1) running multiple training sessions on two or more AI models at the same time, 2) creating two or more AI models at the same time, 3) running a training session on one or more AI models while creating one or more AI models at the same time, 4) deploying and using two or more trained AI models to do predictions on data from one or more data sources, and 5) any combination of these four, on the same AI engine. CPU bound services can include, for example, a document database for storing AI objects such as an AI database, a Relational Database Server such as PostgreSQL, a time-series database such as InfluxDB database, a Brain service including an architect module and AI compiler, Brain web service, a conductor service, a watchman service, a CPU Engineer service, an instructor process, a predictor service, and other similar processes. GPU Bound services can include, for example, a GPU Engineer service, a learner process, and other computationally heavy services. For example, a first CPU computing device may load and run an architect module. A second CPU computing device may load and run, for example, an instructor process. A first GPU computing device may load and run, for example, a learner process. A first service such as an engineer service, may then change an amount of computing devices running independent processes by dynamically calling in a third CPU computing device to load and run, for example, a second instance of the instructor process, and calling in a second GPU computing device to load and run, for example, a second instance of the learner process.

Scaling in this system requires dynamically changing both 1) an amount of independent processes running and 2) an amount of computing devices configured to run those independent processes, where the independent processes are configured to cooperate with each other. The dynamically changing of an amount of computing devices, for example, more GPUs or CPUs in order to run additional instance of the independent processes allows multiple users to utilize the cloud-based system at the same time and to, for example, 1) conduct multiple training sessions for AI models, 2) deploy AI models for use, and 3) create new AI models, all at the same time. Clusters of hardware of CPU devices and GPU devices can be dynamically scaled in and out on, for example, an hourly basis based on percent load capacity used and an amount of RAM memory left compared to a current or expected need.

FIG. 1B provides a schematic illustrating an AI system 700B in accordance with some embodiments. Following on the AI system 700A, a bastion host server and one or more CPU computing devices, such as a first CPU computing device 709A and a second computing device 709B, can be on a public subnet for bidirectional communication through an Internet gateway. One or more GPU computing devices, such as a First GPU computing device 711A, can be on a private subnet communicatively coupled with the public subnet by means of a subnet there between. The one or more CPU computing devices on the public subnet can be utilized on a first CPU computing device 709A by the compiler and the architect module/process that are part of a Brain service. One or more other CPU computing devices on a second CPU computing device 709B on the private subnet can be utilized by the instructor module. The GPU computing devices can be utilized by the learner module/process and the predictor module/process. As further shown in FIG. 1B, the private subnet can be configured to send outgoing communications to the Internet through a network address translation ("NAT") gateway.

Each of the independent process can be running its own computing device 709A-711A and then using a subnet to communicate communications between the other independent processes. As capacity exists, some independent processes may share a computing device. Also, using the subnets is much faster than, for example trying to conduct communications through the Internet via the Gateway, which would have a longer round-trip delay time or lag time.

Individual processes programmed to achieve and perform different functions within the AI engine are broken up into an individual process, each in its own software container. For example, 1) the architect process can be configured to create, instantiate, and figure out the topology of AI model corresponding to a concept being trained for artificial intelligence, 2) an instructor process can be configured to guide the training and how to do the training, and 3) a learner process to carrying out an actual execution of the training as well as 4) a predictor process, during an AI models deployment, to make use of a trained AI model. Breaking these up into individual processes/modules that are aware of each other and know which process and/or service to call and how to call that process and also know which inputs and outputs to send to each other, allows the training to be broken up into these multiple discrete individual services.

Each backend process is configured as an independent process wrapped in its own container so that multiple instances of the same processes, (e.g.) learner and instructor, may be running simultaneously to scale to handle multiple users running training sessions, deploying AI modules, and creating AI models, all at the same time. Thus, the backend cloud platform for the AI engine exists with servers, processes, and databases, that allows many users to connect over a wide area network, such as the Internet, from multiple computing devices and then the backend of the cloud platform is configured to handle the scaling, efficiency, etc. by dynamically calling in additional computing hardware machines to load on and run the independent processes of, for example, an instance of the learner and/or instance of the instructor, as needed.

The multiple independent processes carry out four or more separate tasks by interaction with and cooperation between the multiple independent processes. A first task can be creating a shell of an AI model, such as creating a BRAIN. A second task can be loading in a file of scripted code in a programming language to help define 1) a topology of processing nodes in the AI model, 2) a layout of the concepts making up the AI model, and 3) a selection of an appropriate learning algorithm for the AI model. The file created in pedagogical software programming language, such as Inkling™, helps the architect module to create the topology of processing nodes in the AI model, the layout of the concepts making up the AI model, etc. derived from the programming code. The third task is starting to train the AI model with a data source, such as a simulator. The fourth task is then deploying and using a trained AI model to do, for example, predictions on data from the data source.

Each independent process, such as 1) the instructor module, 2) the learner module, and 3) the architect module as part of a Brain service can be configured to be able to operate on either of a CPU computing device or a GPU computing device or both.

FIG. 2 provides a schematic illustrating an AI system in accordance with some embodiments.

Brief Discussion of Components in the AI Engine

As discussed, the AI engine for generating the trained AI model 106 can include one or more AI-generator modules selected from at least an instructor module 324, an architect module 326, and a learner module 328 as shown. The instructor module 324 can optionally include a hyperlearner module 325, and which can be configured to select one or more hyperparameters for any one or more of a neural network configuration, a learning algorithm, and the like. The hyperlearner module 325 can optionally be contained in a different AI-generator module such as the architect module 326 or the learner module 328, or the hyperlearner module 325 can be an AI-generator module itself. The learner module 328 can optionally include a predictor module 329, which can provide one or more predictions for a trained AI model. The predictor module 329 can optionally be contained in a different AI-generator module such as the instructor module 324 or the architect module 326, or the predictor module 329 can be an AI-generator module itself. The AI engine including the foregoing one or more AI-generator modules can be configured to generate the trained AI model, such as trained AI model 106, from compiled scripted software code written in a pedagogical software programming language via one or more training cycles with the AI engine.

Note, each trained AI model itself, such as a BRAIN, can be a collection of trained AI objects corresponding to a main concept and a set of sub concepts feeding parameters into the main concept. The AI database can index AI objects corresponding to the main concept and the set of sub concepts making up a given trained AI model so that reuse, recomposition, and reconfiguration of all or part of a trained AI model is possible.

One or more clients 210 can make a submission to create a trained AI model. Once a Mental Model and Curricula have been coded in the pedagogical software programming language, then the code can be compiled and sent to the three main modules, the learner module 328, the instructor module 324, and the architect module 326 of the AI engine for training. One or more user interfaces 212, such a web interface, a graphical user interface, and/or command line interface, will handle assembling the scripted code written in the pedagogical software programming language, as well as other ancillary steps like registering the line segments with the AI engine, together with a single command. However, each module—the AI compiler module 222, the web enabled interface 221 to the AI engine, the learner module 328, etc.—can be used in a standalone manner, so if the author prefers to manually invoke the AI compiler module, manually perform the API call to upload the compiled pedagogical software programming language to the modules of the AI engine, etc., they have the flexibility and freedom to do so.

Thus, one or more clients 210 can send scripted code from the coder 212 or another user interface to the AI compiler 222. The AI compiler 222 compiles the scripted software code written in a pedagogical software programming language. The AI compiler 222 can send the compiled scripted code, similar to an assembly code, to the instructor module 324, which, in turn, can send the code to the architect module 326. Alternatively, the AI compiler 222 can send the compiled scripted code in parallel to all of the modules needing to perform an action on the compiled scripted code. The architect module 326 can propose a vast array of machine learning algorithms, such as various neural network layouts, as well as optimize the topology of a network of intelligent processing nodes making up an AI object. The architect module 326 can map between concepts and layers of the network of nodes and send one or more instantiated AI objects to the learner module 328. Once the architect module 326 creates the topological graph of concept nodes, hierarchy of sub concepts feeding parameters into that main concept (if a hierarchy exists in this layout), and learning algorithm for each of the main concept and sub concepts, then training by the learner module 328 and instructor module 324 may begin.

The instructor module 324 can request training data from the training data source 219. Training can be initiated with an explicit start command in the pedagogical software programming language from the user to begin training. In order for training to proceed, the user needs to have already submitted compiled pedagogical software programming language code and registered all of their external data sources such as simulators (if any are to be used) via the user interfaces with the learner and instructor modules 324, 326 of the AI engine.

The training data source 219 can send the training data to the instructor module 324 upon the request. The instructor module 324 can subsequently instruct the learner module 328 on training the AI object with pedagogical software programming language based curricula for training the concepts into the AI objects. Training an AI model can take place in one or more training cycles to yield a trained state of the AI model 106. The instructor module 324 can decide what pedagogical software programming language based concepts and streams should be actively trained in a mental model. The instructor module 324 can know what are the terminating conditions for training the concepts based on user criteria and/or known best practices. The learner module 328 or the predictor 329 can elicit a prediction from the trained AI model 106 and send the prediction to the instructor module 324. The instructor module 324, in turn, can send the prediction to the training data source 219 for updated training data based upon the prediction and, optionally, instruct the learner module 328 in additional training cycles. When the one or more training cycles are complete, the learner module 328 can save the trained state of the network of processing nodes in the trained AI model 106. (Note a more detailed discussion of different embodiments of the components making up the AI engine occurs later.)

Concepts and Mental Models

FIGS. 3A and 3B provide schematics respectively illustrating mental models 500A and 500B in accordance with some embodiments.

Pedagogical programming one focuses on codifying two main pillars: what are the concepts associated with the problem domain (and mentally how do they relate to each other); and, how would one go about teaching those concepts?

A concept is something that can be learned. Once learned it can provide intelligent output. An AI object may learn and be trained on a particular concept. An AI object corresponding to a particular concept can receive input data from other AI objects/concepts and simulators, and send output data to other AI objects/concepts or as a AI object corresponding to a main concept produce a final result/output. A concept can be used in isolation, but it is typically more useful to construct some structured relationship of connectivity, such as a hierarchy, between the related concepts, beginning with the relatively simple concepts and then building into more complex concepts. For example, 'ball location' is a relatively simple concept; whereas, 'get high score' with the ball is a more complex concept. In another example, a complex mental model of flying a plane may have a main concept of 'flying a plane' and numerous sub concepts such as 'how to navigate and move a plane from point A to point B', 'how to avoid crashing into objects', 'how to take off into flight', 'how to land from flight', etc. Each of the sub concepts feeds one or more outputs either directly or indirectly into the main concept of 'flying a plane' when undergoing training on the main concept. The architect module 326 creates the structured relationship of connectivity between these concepts based on user supplied guidance in the pedagogical programming language code.

A concept in a pedagogical programming language may be something that an AI object can be trained on and learn. A concept can fall into one of at least two groups: fact and strategy. A fact-type concept can describe a state of one or more things such as an object, a ball, a character, an enemy, a light, a person, or the like. The state can be whether the one or more things are on or off, hot or cold, a number or a letter, or the like. The fact-type concept can also describe a location. A strategy-type concept can reflect a method or a behavior such as "avoid ghosts," "keep the paddle under the ball," "don't run into walls," "turn lights off," "get high score," or the like. Both FIGS. 3A and 3B show mental models including the strategy-type concept "get high score."

A mental model in a pedagogical programming language is also something that an AI object can be trained on and learn. A mental model can include one or more concepts structured in terms of the one or more concepts, and the mental model can further include one or more data transformation streams. As shown in FIG. 3A, a single-concept mental model can include, for example, a strategy-type concept such as "get high score." As shown in FIG. 3B, a multi-concept mental model can include a hierarchical structure including, for example, strategy-type concepts such as "keep paddle under ball" and "get high score" and state-type concepts such as "ball location." The sub concepts of "keep paddle under ball" and "ball location" feed parameters directly or indirectly into the main concept of "get high score" with the ball. A concept in a multi-concept mental model can receive input from other concepts in the mental model, send output to other concepts in the mental model, provide a final output or result output, or a combination thereof. Addition of more concepts to a mental model can decrease training time for an AI object, as well as enable a trained AI object to give smarter, more accurate predictions. Each trained concept may be AI object.

Foundational Primitives

AI systems and methods provided herein enable a teaching-oriented approach by providing a set of foundational primitives that can be used to represent AI without specifying how the AI is created. These foundational primitives are 1) concepts and mental models, 2) curricula and lessons, and 3) training sources.

More on Concepts and Mental Models

As discussed, the term Mental Model may describe a set of structured concepts. The collection of concepts and their interrelation models the problem domain; and, can be referred to as the mental model. Given this choice of mental model frames, one would then codify the underlying concepts and their relationships.

Curricula and Lessons. A Curriculum is used to teach a concept. To do this, the user needs to provide data to train the concept and tell the AI engine whether the system's understanding of the concept is correct or not. This is analogous to a teacher assigning readings from a book to a student and subsequently testing the student on the contents of the book. The ways in which this data is presented is broken into individual components called Lessons. In the book analogy, Lessons could be individual chapters in the book. Lessons allow the concept to learn bit-by-bit, rather than all at once.

The concept keyword declares an abstract concept that is to be learned by the system. Ultimately, this takes the form of a transformation of data, but no information need be provided about how to perform the calculation. By declaring a concept in the scripted in a pedagogical software programming language, the programmer instructs the architect module 326 of the AI engine that this is a node in the recurrent AI network making up the AI model that must be learned. Consequently, each concept node must have corresponding curricula to teach that node of performing its output function based on its input parameters.

Because concepts are learned by each AI model, their declarations tend to be fairly simple unless one wants to explicitly tell the architect module 326 of the AI what learning algorithms and architecture to use. A typical statement will look something like this:

```
concept AbstractConceptName
is classifier
follows AntecedentConcept1, AntecedentConcept2
feeds DependentConcept1
```

In an embodiment, the 'follows and feeds keywords' establish connectivity in the directed graph of nodes in the trained AI model in the same way that the 'from and into keywords' do in stream declarations. In addition, however, one can optionally append a plus or minus sign (+/−) to the end of the 'follows or feeds keywords' as hints to the architect module 326. The presence of the plus or minus sign indicates whether inhibition is disallowed or desired, respectively. This is useful in a recurrent context, where, for example, a concept may have many ambiguous interpretations and inhibition can aid in resolving the ambiguity.

The keyword specifies the overall class of concept that is being modeled. For example, a classifier will learn to identify a label corresponding to its input, an estimator will learn to predict a value, a predictor will learn sequences and predict subsequent items in a sequence, etcetera. This keyword the entirety of the code needed. The system will, using this code, proceed to determine an appropriate learning topology that can realize the intent. In this case, the architect module 326 laid out a deep learning neural network very much like LeNet. The instructor module 324 will then proceed to execute the best available lesson in the curriculum and will stream data to it. Upon deployment, a user would be able to stream an image into the system and get predictions out. Note that at no point were any low level artificial intelligence or machine learning algorithmic details codified by a user but rather these low level details were generated by the architect module 326 by pulling the topology of a given network processing nodes and a best machine learning algorithmic from reference databases.

An example of a trained AI model may be a Basic Recurrent Artificial Intelligence Network (BRAIN). A BRAIN is an individual AI agent, and it is programmed to learn using a software language such as Inkling. Each BRAIN can reside in the AI Engine, which manages and automates much of the lower level, complexities of working with artificial intelligences. At its heart, a BRAIN can be a basic network of intelligent processing nodes that comprise a potentially recurrent network, hence the acronym "BRAIN." In an embodiment, a trained AI model, such as trained AI model 106, may be a pedagogical programmed AI model that has been trained on one or more concepts.

The Multiple Independent Processes Carry Out Four or More Separate Tasks

FIGS. 4A-4B illustrate a flow diagram of an embodiment of multiple processes in an AI engine cooperating with other components. The example steps below need not be performed in sequential order and some of the steps may be optional.

In steps 110-150, the multiple independent processes carry out four or more separate tasks by 1) interaction with and 2) cooperation between the multiple independent processes. A first task can be creating a shell of an AI model, such as creating a shell of a BRAIN. A second task can be loading in a file of scripted code in a programming language to help define a topology of processing nodes in the AI model, a layout of the concepts making up the AI model, and a selection of an appropriate learning algorithm(s) for the AI model. The file created in the pedagogical software programming language, such as Inkling™, helps the architect module to create the structural details and other details of the AI model. The third task can be starting to train the AI model with a data source, such as a simulator. The fourth task can be then deploying a trained AI model and using the trained AI model to do predictions on data from the data source.

Some of the major independent processes configured into the AI engine can be as follows. A brain service may include a HTTP application programming interface, an AI compiler, and an architect module. Note, the architect module could be 1) an independent process on its own or 2) part of the brain service as here in this example. Another independent process is the instructor process and CPU engineer service. Another independent process is the predictor process. Another is the watchman process. Another is the learner process with its GPU engineer service. Another is the conductor. Another is the brain web service. Note, most of these processes are standalone services but they can be incorporated into a larger coding file to be part of another service or process. A software container is configured to wrap one or more pieces of software in a complete file system containing everything for execution including code, runtime, system tools, system libraries, etc. Note, the HTTP API may be a restful API.

In an embodiment, the CPU engineer may be coded to invoke and put processes onto the CPU computing devices including instances of the instructor process and predictor process, when needed. The GPU engineer may be coded to invoke and put, for example, instances of the learner process onto the GPU hardware as needed. The conductor service and/or engineer service may be configured to handle scaling by dynamically calling in additional computing devices to load on and run additional instances of one or more of the independent processes wrapped in its own container, such as the learner and/or instructor, as needed. When instances of the learner process and/or instructor process are not available to effectively run a training session of a given AI model, then a new instance of the learner process and/or instructor process is invoked and run on a computing device.

In step 102, the multiple independent processes are configured as an independent process wrapped in its own software container so that multiple instances of the same processes can run simultaneously in order to scale to handle one or more users to perform actions to solve AI problems. The actions to solve AI problems can include 1) running multiple training sessions on two or more AI models at the same time, 2) creating two or more AI models at the same time, 3) running a training session on one or more AI models while creating one or more AI models at the same time, 4) deploying two or more trained AI models and using the trained AI models to do predictions on data from one or more data sources, and 5) any combination of these four, on the same AI engine. In an embodiment, five or more simulations may be simultaneously running at the same time. In an embodiment, ten or more training sessions may be simultaneously running at the same time. In an embodiment, twenty or more training sessions may be simultaneously running at the same time.

In step 104, a first service of the independent processes is configured to handle scaling by dynamically calling in additional computing devices to load on and run additional instances of one or more of the independent processes wrapped in its own container as needed. An independent process, such as a scheduler, monitors the amount of the available hardware resources, such as percent resources used. An independent process, such as the scheduler, also looks at the incoming resource requests from, for example, the amount of AI model deployments and training sessions occurring on the single AI engine, in order to decide to dynamically change the amount of computing devices operating instances of the independent processes that are in containers. The scheduler may cooperate with or be part of CPU engineer service, conductor service, and/or GPU engineer service. The scheduler may assign a role to each individual process, use an auto scaling service to scale the processes in their software containers in response to load across the systems services, and use a Load Balancer to distribute load across a current set of computing devices, while automatically checking new tasks into the load balancer when auto scaling actions occur. When the scheduler is asked to run a new task, the scheduler determines the individual processes, each in their own containers needing to accomplish the task, and then finds a suitable set of one or more computing machines to run the individual processes by identifying an instance in the cluster of computing devices with available resources. Long running processes, such as an instance of the learner and instance of the instructor, conducting a training session for a particular AI model could each run on its own GPU or CPU computing device in the cloud. An individual AI model being trained may only take a part of a CPU's capacity or may take up an entire GPU's capacity to train that AI model at that time. Multiple instances of the independent processes may be invoked to handle multiple AI models being trained or being deployed at the same time simultaneously. Note, each of the AI models maybe training or being deployed to solve a completely different problem in completely different technologies.

In step 110, the first task can be creating a shell of an AI model, such as creating a BRAIN. In an embodiment in the first task, an architect module of the brain service receives a request from a client device of the user to create an AI model. Anyone of three or more different user interfaces may supply a command to request the creation of an AI model. The three different user interfaces are a command line interface, a web interface, and a graphical user interface such as Mastermind™. The three different user interfaces allow for multiple users of different levels of capability and programming to all utilize the AI engine hosted on this cloud platform. A request comes in to create an AI model into the brain web interface. The brain service is called by the brain web interface to create an AI model record for that user. The brain web interface may also make a call to a user's database in order to verify the account of the user and call up any previous information including account information about the user. The brain service then creates an AI model document by calling over to the AI database, for example, the MongoDB document database. The brain service registers the request and sends it on to the AI database. The AI database creates a new shell document to contain an AI model to be fleshed out with details and then trained. The new shell will have a unique ID number or at least a unique version of that ID model. When success is indicated, then the brain service via the brain web interface sends back to the client device of the user of the cloud platform that the initial shell document of the AI model has been successfully created. Thus, the brain service registers an incoming request and then creates a shell for the AI model with the architect module. Note, the architect module may be its own independent process in its own container or part of the brain service in its container.

In step 120, the second task can be loading in a file of scripted code in the pedagogical software programming language to help define 1) a topology of processing nodes in the AI model, 2) a layout of the concepts making up the AI model, 3) a selection of an appropriate learning algorithm for the AI model, and 4) other similar details in order to flesh out the details of the AI model and then instantiate the AI model. In an embodiment in the second task, an architect module of the brain service receives scripted code to create a topology of neural networks, select one or more learning algorithms, and then instantiate an AI model assigned with a unique identifier, all based on a description of a problem to solve codified in a pedagogical software programming language. The loading of the file written in the pedagogical software programming language occurs. The file written in the pedagogical software programming language is put through a restful web socket. The file is sent to the brain service and then the brain service applies the AI compiler, which uses a library with executables to compile the scripted code and parse through the scripted code to detect errors in the syntax of the code, etc. The file created in the pedagogical software programming language, such as Inkling™, helps the architect module to design a graph of concepts, etc. in the AI model. The architect module of the brain service fills out a topology of the processing nodes in the model, a layout of the concepts making up the AI model, and selected appropriate learning algorithm(s) for this AI model into the shell of the AI model. The architect module may look at the type of problem being solved in the pedagogical software programming language and see what similar architectures have worked to solve a similar problem. The architect module portion of the brain service also then instantiates, for example, the topology for neural networks and graph of concepts for each concept node derived from statements written in the codified pedagogical software programming language. After the shell of the AI model with the topology of the graph of processing nodes is created with the appropriate learning algorithm(s) and has been assigned a unique ID, then the AI database stores the AI models as well as portions of AI models. After the shell of the AI model with the topology of the graph of processing nodes is instantiated with the appropriate learning algorithm(s) and has been assigned a unique ID, then the next task starts, which is training an instantiated AI model with a data source.

In step 130, the third task is starting to train the AI model with some sort of data source, such as a simulator, according to a lesson plan and curriculum. In an embodiment in the third task, an instructor process is configured to carrying out a training plan codified in a pedagogical software programming language. The learner process is configured to carrying out an actual execution of underlying AI learning algorithms during the training session. The learner module can also consistently update weights of the learning algorithm(s) in the AI model. The instructor process and the learner process of the independent processes cooperate with one or more data sources to train a new AI model. The conductor, via an API, receives a start and set up training command. The conductor may be coded as a service. The conductor service in combination with the brain service can be the components in the system responsible for coordinating activities between the instructor process, the learner process, and the training data source. In an embodiment, the conductor is a Docker™-type service.

In an embodiment, a client device of the user starts the training of an AI model, via a user interface, by sending a call command to send to train the AI model to the brain service. The brain service then sends a start training components command to the conductor. The conductor then sends a request to the AI database to retrieve the instantiated AI model. In an embodiment, the copy of the latest version of the AI model is retrieved. Note, in an embodiment, the conductor obtains multiple versions of the AI model, potentially with different neural networks and learning algorithms in order to train two or more instances of this AI model in parallel on the same AI engine. Each AI model is then trained with its own instances of the independent processes of the learner and instructor. The conductor sends a start instructor command to the CPU engineer, which then starts an instance of the instructor process on a CPU computing device. The CPU engineer invokes as many instances of the instructor process as necessary/as needed to service the multiple AI model's being trained. Each time another AI model is being trained another instructor process may be invoked. The conductor also sends a start learner command, via a call, to the GPU engineer. The GPU engineer invokes and starts an instance of a learner module on an available GPU computing device. The GPU engineer invokes as many instances of the learner process as necessary/as needed to service the multiple AI model's being trained. Once the instance of the instructor is loaded onto and running on the CPU hardware, the instructor then may go to the AI database to get the curriculum and lessons from the AI database. Training lessons may come from the pedagogical software programming language file, which was compiled and put into the AI database as a document associated with this AI model being trained. Similarly, the learner process once started will send a command to the AI database to get a document of the concepts, their curriculum, and the individual lessons to be trained on, which can be derived from the codified pedagogical software programming language and/or reference databases of best training practices. Note, the learner may receive most of the commands on the training from the instructor process conducting the training session in accordance with the curriculum and individual lesson plans.

Next for the training, the data sources register with the brain web interface. The brain service opens the web socket, for example, for simulation through the open web socket. The brain service acknowledges the registration with the data source. The brain service then directly talks to the instructor process that a data source is ready to start sending data to the instructor process. The instructor process sends back that it is ready to start the training. A start command to the data source, such as a simulator, random data generator, etc. is initiated. The data source then connects to the AI model. A recursive and reiterative loop occurs between the instructor process, the learner process, and the data source to send data to the AI model for training. Based on the new data, the AI model updates the state information of different portions making up the AI model and the instructor process sends the updated state information back to the data source. The data source sends more data and/or a prediction to the instructor process. This loop occurs between the instructor and the data source to send data and/or predictions, update and run the training, get back state, and then repeat.

Also, the instructor process can send state and prediction information to the learner process. Thus, in the recursive and reiterative loop, the learner process takes part in training of the instantiated AI model with the state information and predictions. The learner records the new state data for the AI model. The learner process records the episodes and reward information into a time database and sends the current function objective value back to the instructor process. The reiterative loop occurs between training with state and predictions, recording the reward information, and sending back the objective value and a current function occurs between the instructor and the learner. The learner continuously writes to the instructor with the state of the training and writes out new weights for the learning algorithms. Based on constraints or other statements in the code, such as inkling, eventually the learner knows when to stop the reiterative loop of sending data between the data source, training with that data, making predictions, adjusting coefficient weights, and getting better accuracy with the trained AI model. In the end, the criteria of the trainings are achieved. The instructor process will write out the trained network data to the AI database, where the model being trained has its own unique ID. The overall trained AI model will have learned optimum weights for the coefficients of the learning algorithms for each trained AI object corresponding to either a main concept or sub concept forming the trained AI model. The trained AI model with its unique ID and version of that AI model is then stored in the AI database.

In step 140, the independent processes include a watchman service configured to monitor to see if any of 1) when failures occur in any of the other independent processes and 2) when any of the other independent processes exit, and then to tell all of the independent processes that were participating in that training to exit the training session that they were cooperating in. Similarly, the watchman service can monitor deployment and use sessions with the trained AI model and/or AI model creation sessions to tell all of the independent processes that were participating in that AI event to exit when a failure occurs or when one of the other independent processes exit.

In step 150, the fourth task is then deploying a trained AI model and using the trained AI model to do predictions and/or other actions on data from one or more data sources, such as a simulator, random data generator, database, etc.

A trained AI model may then be used to predict many things. For example, trained AI model connected to a data source may predict what will occur 1) during an example simulation or 2) during real time streaming such as during a video game to make decisions for the digital creatures in that game, based on the training in the AI model. The data source connects to the trained AI model with a command to the brain service. The brain service then makes a call to the instructor process to launch a predictor process and to tell the instructor process that registration has occurred. The brain service loads the trained AI model. The brain service opens up the AI document database for registration. The brain service opens up a website socket for simulation. In addition, the brain service connects back to the data source and conveys that the data source is registered and that the predictor process is ready to start. Lastly, a loop repeats to start the simulation, send that data to the predictor, and the predictor then makes predictions based on the trained AI models, which are then sent back to the data source until the deployment of the AI model ends.

Note, the AI system uses software defined processes wrapped in a container over using individual daemons because the software defined processes, each in its own container, scale better to a dynamically changing amount or set of hardware configuration. The AI engine decoupled from using a set of daemons as coordinating agents between different functions in an AI engine, over to instances of self-sufficient independent processes, so that the AI engine system can scale to handle multiple users at the same time using the single AI engine hosted on the cloud platform. The multiple users may be creating AI models as well as training AI models.

Each module can be structured as an independent process so it may work with other processes but can exist outside and run its function without the need of the other processes.

More on the AI Engine

The AI system enables developers to more efficiently build, teach, and use intelligence models.

The AI engine takes in a description of a problem and how one would go about teaching concepts covering aspects of the problem to be solved, and the AI engine compiles the coded description into lower-level structured data objects that a machine can more readily understand, builds a network topology of the main problem concept and sub-concepts covering aspects of the problem to be solved, trains codified instantiations of the sub-concepts and main concept, and executes a trained AI model containing one, two, or more neural networks.

The AI engine can abstract generation of a neural network topology for an optimal solution and faster training time with a curriculum and lessons to teach the neural network via recursive simulations and training sessions on each node making up the neural network.

The AI engine can contain a vast array of machine learning algorithms, has logic for picking learning algorithms and guiding training, manages data streaming and data storage, and provides the efficient allocation of hardware resources. The AI engine can be built with an infrastructure that supports streaming data efficiently through the system. The AI engine can use a set of heuristics to make choices about which learning algorithms to use to train each BRAIN. The set of heuristics also make it possible for the AI engine to choose from any number of possible algorithms, topologies, etc., be able to train a number of BRAINs in parallel, and then pick the best result from all of the train BRAINs as the best trained AI model for that task.

Major Components of the AI Engine

FIG. 5 provides a schematic illustrating an AI system including an AI engine in accordance with some embodiments.

The details for any given implementation of a AI engine may vary substantially, but many have common architectural components such as the following six components: 1) an architect module 326, 2) an instructor module 324, 3) a learner module 328, 4) a compiler module 222, 5) a hyperlearner module 325, and 6) one or more interfaces 212 exchanging communications into and out of the AI engine. The AI database 341 may cooperate with the modules of the AI engine as discussed above.

The AI engine can be a cloud-hosted platform-as-a-service configured to manage complexities inherent to training AI networks. Thus, the AI engine can be accessible with one or more client-side interfaces 212, GUI, CLI, and Web interfaces, to allow third parties to submit a description of a problem in a pedagogical programming language with possible sub concepts that factor in that problem and let the online AI engine build and generate a trained intelligence model for one or more of the third parties.

The AI system includes the coder 212 on the one or more client systems and the following on the one or more server systems: the AI compiler module 222; the AI-generator modules including the instructor module 324, the architect module 326, and the learner module 328, the hyperlearner 325, and the predictor 329 module 329. In addition to the foregoing, the AI system can include a training data loader 621 configured to load training data from a training data database 614*a*, a simulator 614*b*, and a streaming data server. The training data can be batched training data, streamed training data, or a combination thereof, and the AI engine can be configured to push or pull the training data from one or more training data sources selected from the simulator 614*b*, a training data generator, the training data database 614*a*, or a combination thereof. In some embodiments, a data stream manager can be configured to manage streaming of the streamed training data. FIG. 5 shows the architect module 326 configured to propose a neural network layout and the learner module 328 configured to save a trained state of a neural network such as the trained AI model 106.

The AI compiler module 222 automates conversion and compiling of the pedagogical programming language describing the problem (main concept) and sub-concepts factoring into the problem. Each statement recited in the code of the pedagogical programming language program submitted to the AI engine can be complied into a structured data object's defined fields, which can later be generated and instantiated into its own sub-concept node by the architect module 326. Each node can have one or more inputs one or more neural networks to process the input data and a resulting output decision/action. The compiled statements, commands, and other codifications fed into the AI compiler can be transformed into a lower level AI specification.

The Architect Module

The architect module 326 is the component of the system responsible for proposing and optimizing learning topologies (e.g., neural networks) based on mental models.

Neural networks can be based on a large collection of neural units loosely modeling the way a biological brain solves problems with large clusters of biological neurons connected by axons. Each neural unit is connected with many others, and links can be enforcing or inhibitory in their effect on the activation state of connected neural units. Each individual neural unit can have, for example, a summation function, which combines the values of all its inputs together. There may be a threshold function or limiting function on each connection and on the unit itself such that it must surpass it before it can propagate to other neurons. These systems are self-learning and trained rather than explicitly programmed and excel in areas where the solution or feature detection is difficult to express in a traditional computer program.

Neural networks can consist of multiple layers or a cube design, and the signal path can traverse from front to back. The goal of the neural network is to solve problems in the same way that the human brain would, although several neural networks are much more abstract. Modern neural network projects typically work with a few thousand and up to a few million neural units and millions of connections.

The architect module 326 can take the codified mental model and pedagogy and then propose a set of candidate low-level learning algorithms, topologies of a main concepts and sub-concepts, and configurations thereof the architect module 326 believes will best be able to learn the concepts in the model. This is akin to the work that a data scientist does in the toolkit approach, or that the search system automates in the approach with statistical data analysis tools. Here, it is guided by the pedagogical program instead of being a broad search. The architect module 326 can employ a variety of techniques to identify such models. The architect module 326 can generate a directed graph of nodes. The architect module 326 can break down the problem to be solved into smaller tasks/concepts all factoring into the more complex main problem trying to be solved based on the software code and/or data in the defined fields of the user interface supplied from the user/client device. The architect module 326 can instantiate a main concept and layers of sub-concepts feeding into the main concept. The architect module 326 can generate each concept including the sub-concepts with a tap that stores the output action/decision and the reason why that node reached that resultant output (e.g., what parameters dominated the decision and/or other factors that caused the node to reach that resultant output). This stored output of resultant output and the reasons why the node reached that resultant output can be stored in the trained intelligence model. The tap created in each instantiated node allows explainability for each step on how a trained intelligence model produces its resultant output for a set of data input. The architect module 326 can reference a database of algorithms to use as well as a database of network topologies to utilize. The architect module 326 can reference a table or database of best suggested topology arrangements including how many layers of levels in a topology graph for a given problem, if available. The architect module 326 also has logic to reference similar problems solved by comparing signatures. If the signatures are close enough, the architect module 326 can try the topology used to optimally solve a problem stored in an archive database with a similar signature. The architect module 326 can also instantiate multiple topology arrangements all to be tested and simulated in parallel to see which topology comes away with optimal results. The optimal results can be based on factors such as performance time, accuracy, computing resources needed to complete the training simulations, etc.

In some embodiments, for example, the architect module 326 can be configured to propose a number of neural networks and heuristically pick an appropriate learning algorithm from a number of machine learning algorithms in one or more databases for each of the number of neural networks. Instances of the learner module 328 and the instructor module 324 can be configured to train the number of neural networks in parallel. The number of neural networks can be trained in one or more training cycles with the training data from one or more training data sources. The AI engine can subsequently instantiate a number of trained AI models based on the concepts learned by the number of neural networks in the one or more training cycles, and then identify a best trained AI model (e.g., by means of optimal results based on factors such as performance time, accuracy, etc.) among the number of trained AI models.

The user can assist in building the topology of the nodes by setting dependencies for particular nodes. The architect module 326 can generate and instantiate neural network topologies for all of the concepts needed to solve the problem in a distinct two-step process. The architect module 326 can generate a description of the network concepts. The architect module 326 can also take the description and instantiate one or more topological shapes, layers, or other graphical arrangements to solve the problem description. The architect module 326 can select topology algorithms to use based on factors such as whether the type of output the current problem has either 1) an estimation output or 2) a discrete output and then factors in other parameters such as performance time to complete the algorithm, accuracy, computing resources needed to complete the training simulations, originality, amount of attributes, etc.

The Instructor Module

The instructor module 324 is a component of the system responsible for carrying out a training plan codified in the pedagogical programming language. Training can include teaching a network of intelligent processing nodes to get one or more outcomes, for example, on a simulator. To do so, the instructor module 324 can form internal representations about the system's mastery level of each concept, and adapt the execution plan based on actual performance during training. The directed graph of lessons can be utilized by the instructor module 324 to determine an execution plan for training (e.g., which lessons should be taught in which order). The training can involve using a specific set of concepts, a curriculum, and lessons, which can be described in the pedagogical programming language file.

The instructor module 324 can train easier-to-understand tasks earlier than tasks that are more complex. Thus, the instructor module 324 can train sub-concept AI objects and then higher-level AI objects. The instructor module 324 can train sub-concept AI objects that are dependent on other nodes after those other AI objects are trained. However, multiple nodes in a graph may be trained in parallel. The instructor module 324 can run simulations on the AI objects with input data including statistics and feedback on results from the AI object being trained from the learner module 328. The learner module 328 and instructor module 324 can work with a simulator or other data source to iteratively train an AI object with different data inputs. The instructor module 324 can reference a knowledge base of how to train an AI object efficiently by different ways of flowing data to one or more AI objects in the topology graph in parallel, or, if dependencies exist, the instructor module 324 can train serially with some portions of lessons taking place only after earlier dependencies have been satisfied. The instructor module 324 can reference the dependencies in the topology graph, which the dependencies can come from a user specifying the dependencies and/or how the arrangement of AI objects in the topology was instantiated. The instructor module 324 can supply data flows from the data source such as a simulator in parallel to multiple AI objects at the same time where computing resources and a dependency check allows the parallel training.

The instructor module 324 may flow data to train AI objects from many data sources including, but not limited to a simulator, a batch data source, a random-data generator, and historical/guided performance form from past performance. A simulator can give data and get feedback from the instructor module 324 during the simulation that can create an iterative reactive loop from data inputs and data outputs from the AI objects. A batch data source can supply batched data from a database in at least one example. A random-data generator can generate random data based on user-input parameters.

When starting a training operation, the instructor module 324 first generates an execution plan. This is the ordering it intends to use when teaching the concepts, and for each concept which lessons it intends to teach in what order. While the execution plan is executing, the instructor module 324 may jump back and forth between concepts and lessons to optimize the learning rate. By not training each concept fully before starting to train dependent concepts, the system naturally avoids certain systemic machine learning problems such as overfitting. The major techniques used to determine when to switch between lessons and concepts for training are reinforcement learning and adaptive learning. For example, for a first main problem of determining an amount of bankruptcy's in the United States, a first AI object corresponding to a sub concept may be trained in a first lesson on how to determine bankruptcy filings in California. A second lesson may train the first AI object next on how to determine bankruptcy filings in California and York. Successive lessons on an AI object can build upon and augment earlier lessons that the AI object was trained on.

The instructor module 324 looks to reuse similar training flows that have solved similar problems with similar signatures in the past.

Learner Module

The learner module 328 is a component of the system configured to carry out the actual execution of the low-level, underlying AI algorithms. In training mode, the learner module 328 can instantiate a system conforming to what was proposed by the architect module 326, interface with the instructor module 324 to carry out the computation and assess performance, and then execute the learning algorithm itself. The learner module 328 can instantiate and execute an instance of the already trained system. Eventually, the learner module 328 writes out network states for each trained sub-AI object and then a combination of the topological graph of the main node with all of the sub-nodes into a trained AI model. The learner module 328 can also write the stored output of each node and why that node arrived at that output into the trained AI model, which gives explainability as to how and why the AI proposes a solution or arrives at an outcome.

Hyperlearner Module

The hyperlearner module 325 can perform a comparison of a current problem to a previous problem in one or more databases. The hyperlearner module 325 can reference archived, previously built and trained intelligence models to help guide the instructor module 324 to train the current model of nodes. The hyperlearner module 325 can parse an archive database of trained intelligence models, known past similar problems and proposed solutions, and other sources. The hyperlearner module 325 can compare previous solutions similar to the solutions needed in a current problem as well as compare previous problems similar to the current problem to suggest potential optimal neural network topologies and training lessons and training methodologies.

Simulator

When, the curriculum trains using a simulation or procedural generation, then the data for a lesson is not data to be passed to the learning system, but the data is to be passed to the simulator. The simulator can use this data to configure itself, and the simulator can subsequently produce a piece of data for the learning system to use for training. This separation permits a proper separation of concerns. The simulator is the method of instruction, and the lesson provides a way to tune that method of instruction, which makes it more or less difficult depending on the current level of mastery exhibited by the learning system. A simulation can run on a client machine and stream data to the AI engine for training. In such an embodiment, the client machine needs to remain connected to the AI engine while the BRAIN is training. However, if the client machine is disconnected from the server of the AI engine, it can automatically pick up where it left off when it is reconnected. Note, if the system trains using data, then the data is optionally filtered/augmented in the lessons before being passed to the learning system.

Note, 1) simulations and procedural generation are a good choice versus data in a variety of circumstances; and 2) concepts are a good choice versus streams when you can more easily teach versus calculate.

Training Mode

A machine learning algorithm may have of a target/outcome variable (or dependent variable) which is to be predicted from a given set of predictors (independent variables). Using this set of variables, the AI engine generates a function that maps inputs to desired outputs. The coefficients and weights plugged into the equations in the various learning algorithms are then updated after each epoch/pass of training session until a best set of coefficients and weights are determined for this particular concept. The training process continues until the model achieves a desired level of accuracy on the training data.

When in training mode the architect module 326 of the AI engine is configured to i) instantiate the network of processing nodes in any layers of hierarchy conforming to concepts of the problem being solved proposed by the user and ii) then the learner module 328 and instructor module 324 train the network of processing nodes in that AI model. To effect the foregoing, the AI engine can take compiled pedagogical programming language code and generate a BRAIN learning topology, and proceed to follow the curricula to teach the concepts as specified. Depending on the model, training can potentially take substantial amounts of time. Consequently, the AI engine can provide interactive context on the status of training including, for example, showing which nodes are actively being trained, the current belief about each node's mastery of its associated concept, overall and fine-grained accuracy and performance, the current training execution plan, and/or an estimate of completion time. As such, in some embodiments, the AI engine can be configured to provide one or more training status updates on training a neural network selected from i) an estimation of a proportion of a training plan completed for the neural network, ii) an estimation of a completion time for completing the training plan, iii) the one or more concepts upon which the neural network is actively training, iv) mastery of the neural network on learning the one or more concepts, v) fine-grained accuracy and performance of the neural network on learning the one or more concepts, and vi) overall accuracy and performance of the neural network on learning one or more mental models.

Because the process of building pedagogical programs is iterative, the AI engine in training mode can also provide incremental training. That is to say, if the pedagogical programming language code is altered with respect to a concept that comes after other concepts that have already been trained, those antecedent concepts do not need to be retrained.

Additionally, in training mode, the user is able to specify what constitutes satisfactory training should the program itself permit indefinite training.

Algorithm Selection

A first step an AI engine can take is to pick an appropriate learning algorithm to train a mental model. This is a notable step in training AI, and it is a step those without AI expertise cannot perform without expert guidance. The AI engine can have knowledge of many of the available learning algorithms, as well as a set of heuristics for picking an appropriate algorithm including an initial configuration to train from.

The process of picking an appropriate algorithm, etc., can be performed by a BRAIN that has been trained (and will continue to be trained) by the AI engine, meaning the BRAIN will get better at building BRAINs each time a new one is built. A trained AI-engine neural network, such as a BRAIN, thereby provides enabling AI for proposing neural networks from assembly code and picking appropriate learning algorithms from a number of machine learning algorithms in one or more databases for training the neural networks. The AI engine can be configured to continuously train the trained AI-engine neural network in providing the enabling AI for proposing the neural networks and picking the appropriate learning algorithms thereby getting better at building BRAINs.

The architect module 326 can also use heuristics, mental model signatures, statistical distribution inference, and Meta-learning in topology and algorithm selection.

First, the AI engine and the architect module 326 thereof can be configured to heuristically pick an appropriate learning algorithm from a number of machine learning algorithms in one or more databases for training the neural network proposed by the architect module 326. Many heuristics regarding the mental model can be used to inform what types of AI and machine learning algorithms can be used. For example, the data types used have a large influence. For this reason, the pedagogical programming language contains rich native data types in addition to the basic data types. If the architect module 326 sees, for example, that an image is being used, a convolutional deep learning neural network architecture might be appropriate. If the architect module 326 sees data that is temporal in nature (e.g., audio data, sequence data, etc.), then a recursive deep-learning neural network architecture like a long short-term memory ("LSTM") network might be more appropriate. The collection of heuristics can be generated by data science and machine learning/AI experts who work on the architect module 326 codebase, and who attempt to capture the heuristics that they themselves use in practice.

In addition to looking at the mental model, the architect module 326 can also consider the pedagogy provided in the pedagogical programming language code. It can, for example, look at the statistical distribution of any data sets being used; and, in the case of simulators, it can ask the simulator to generate substantial amounts of data so as to determine the statistics of data that will be used during training. These distribution properties can further inform the heuristics used.

Meta-Learning

Meta-learning is an advanced technique used by the architect module 326. It is, as the name implies, learning about learning. What this means is that as the architect module 326 can generate candidate algorithm choices and topologies for training, it can record this data along with the signature for the model and the resultant system performance. This data set can then be used in its own learning system. Thus, the architect module 326, by virtue of proposing, exploring, and optimizing learning models, can observe what works and what does not, and use that to learn what models it should try in the future when it sees similar signatures.

To effect meta-learning, the AI engine can include a meta-learning module configured to keep a record such as a meta-learning record in one or more databases. The record can include i) the source code processed by the AI engine, ii) mental models of the source code and/or signatures thereof, iii) the training data used for training the neural networks, iv) the trained AI models, v) how quickly the trained AI models were trained to a sufficient level of accuracy, and vi) how accurate the trained AI models became in making predictions on the training data.

For advanced users, low-level details of a learning topology can be explicitly specified completely or in part. The architect module 326 can treat any such pinning of parameters as an override on its default behavior. In this way, specific algorithms can be provided, or a generated model can be pinned for manual refinement.

Guiding Training

The first step the AI engine will take is to pick an appropriate learning algorithm to train the Mental Model. This is a critical step in training AI. The AI engine has knowledge of many of the available learning algorithms and has a set of heuristics for picking an appropriate algorithm as well as an initial configuration to train from.

Once an algorithm is chosen, the AI engine will proceed with training the BRAIN's Mental Model via the Curricula. The AI engine manages all of the data streaming, data storage, efficient allocation of hardware resources, choosing when to train each concept, how much (or little) to train a concept given its relevance within the Mental Model (i.e. dealing with the common problems of overfitting and underfitting), and generally is responsible for producing a trained AI model based on the given Mental Model and Curricula. As is the case with picking an appropriate learning algorithm, guiding training—notably avoiding overfitting and underfitting—to produce an accurate AI solution is a task that requires knowledge and experience in training AIs. The AI engine has an encoded set of heuristics manage this without user involvement. Similarly, the process of guiding training is also a trained AI model that will only get smarter with each trained AI model it trains. The AI engine is thus configured to make determinations regarding i) when to train the AI model on each of the one or more concepts and ii) how extensively to train the AI model on each of the one or more concepts. Such determinations can be based on the relevance of each of one or more concepts in one or more predictions of a trained AI model based upon training data.

The AI engine can also determine when to train each concept, how much (or little) to train each concept based on its relevance, and, ultimately, produce a trained BRAIN. Furthermore, the AI engine can utilize meta-learning. In meta-learning, the AI engine keeps a record of each program it has seen, the data it used for training, and the generated AIs that it made. It also records how fast those AIs trained and how accurate they became. The AI engine learns over that dataset.

Note, when training of an AI object occurs, the hyper learner module 328 can be configured to save into the AI database 341 two versions of an AI object. A first version of an AI object is a collapsed tensile flow representation of the AI object. A second version of an AI object is the representation left in its nominal non-collapsed state. When the search engine retrieves the AI object in its nominal non-collapsed state, then another programmer desiring to reuse the AI object will be able to obtain outputs from the non-collapsed graph of nodes with all of its rich meta-data rather and then a collapsed concept with a single discrete output. The state of the AI data objects can be in a non-collapsed state so the trained AI object has its full rich data set, which then may be used by the user for reuse, reconfigured, or recomposed into a subsequent trained AI model.

The database management system also indexes and tracks different AI objects with an indication of what version is this AI object. Later versions of an AI object may be better trained for particular task but earlier versions of the AI object maybe more generally trained; and thus, reusable for wider range of related tasks, to then be further trained for that specific task.

The AI database 341 and other components in the AI engine cooperate to allow migrations of learned state to reconfigure a trained AI object. When a system has undergone substantial training achieving a learned state, and a subsequent change to the underlying mental models might necessitate retraining, it could be desirable to migrate the learned state rather than starting training from scratch. The AI engine can be configured to afford transitioning capabilities such that previously learned high dimensional representations can be migrated to appropriate, new, high dimensional representations. This can be achieved in a neural network by, for example, expanding the width of an input layer to account for alterations with zero-weight connections to downstream layers. The system can then artificially diminish the weights on connections from the input that are to be pruned until they hit zero and can then be fully pruned.

Deploy and Use

Once a trained AI model has been sufficiently trained, it can be deployed such that it can be used in a production application. The interface for using a deployed trained AI model is simple: the user submits data (of the same type as the trained AI model was trained with) to a trained AI model-server API and receives the trained AI model's evaluation of that data.

As a practical example of how to use a deployed trained AI model, a trained AI model can first be trained to recognize hand-written digits from the Mixed National Institute of Standards and Technology ("MNIST") dataset. An image can be created containing a handwritten digit, perhaps directly through a touch-based interface or indirectly by scanning a piece of paper with the handwritten digit written on it. The image can then be down sampled to a resolution of 28×28 and converted to grayscale, as this is the input schema used to train the example trained AI model. When submitted to the trained AI model-server through the trained AI model server API, the trained AI model can take the image as input and output a one-dimensional array of length 10 (whereby each array item represents the probability, as judged by the trained AI model, that the image is a digit corresponding to the index). The array could be the value returned to the user from the API, which the user could use as needed.

Though a linear approach to building a trained AI model is presented in some embodiments, an author-train-deploy workflow does not have to be treated as a waterfall process. If the user decides further refinement of a trained AI model is needed, be it through additional training with existing data, additional training with new, supplemental data, or additional training with a modified version of the mental model or curricula used for training, the AI engine is configured to support versioning of BRAINs so that the user can preserve (and possibly revert to) the current state of a BRAIN while refining the trained state of the BRAIN until a new, more satisfactory state is reached.

Command Line Interface ("CLI")

The CLI is a tool configured to enables users to configure the AI engine. The CLI is especially useful for automation and connection to other tools. Some actions can only be performed using the CLI. Some actions that can be performed using the CLI include loading a pedagogical programming language file and connecting a simulator.

Web Site

The web site is configured as a browser-based tool for configuring and analyzing BRAINs stored in the AI engine. The website can be used for sharing, collaborating, and learning. Some information that can be accessed from the web site is a visualization of a BRAIN's training progress.

Network

FIG. 6 illustrates a number of electronic systems and devices communicating with each other in a network environment in accordance with some embodiments. The network environment 800 has a communications network 820. The network 820 can include one or more networks selected from an optical network, a cellular network, the Internet, a Local Area Network ("LAN"), a Wide Area Network ("WAN"), a satellite network, a fiber network, a cable network, and combinations thereof. In some embodiments, the communications network 820 is the Internet. As shown, there may be many server computing systems and many client computing systems connected to each other via the communications network 820. However, it should be appreciated that, for example, a single client computing system can also be connected to a single server computing system. As such, FIG. 6 illustrates any combination of server computing systems and client computing systems connected to each other via the communications network 820.

The communications network 820 can connect one or more server computing systems selected from at least a first server computing system 804A and a second server computing system 804B to each other and to at least one or more client computing systems as well. The server computing system 804A can be, for example, the one or more server systems 220 of FIGS. 1A, 1B, 2, 5, etc. The server computing systems 804A and 804B can each optionally include organized data structures such as databases 806A and 806B. Each of the one or more server computing systems can have one or more virtual server computing systems, and multiple virtual server computing systems can be implemented by design. Each of the one or more server computing systems can have one or more firewalls to protect data integrity.

The at least one or more client computing systems can be selected from a first mobile computing device 802A (e.g., smartphone with an Android-based operating system), a second mobile computing device 802E (e.g., smartphone with an iOS-based operating system), a first wearable electronic device 802C (e.g., a smartwatch), a first portable computer 802B (e.g., laptop computer), a third mobile computing device or second portable computer 802F (e.g., tablet with an Android- or iOS-based operating system), a smart device or system incorporated into a first smart automobile 802D, a smart device or system incorporated into a first smart bicycle 802G, a first smart television 802H, a first virtual reality or augmented reality headset 804C, and the like. The client computing system 802B can be, for example, one of the one or more client systems 210, and any one or more of the other client computing systems (e.g., 802A, 802C, 802D, 802E, 802F, 802G, 802H, and/or 804C) can include, for example, the software application or the hardware-based system in which the trained AI model can be deployed. Each of the one or more client computing systems can have one or more firewalls to protect data integrity.

It should be appreciated that the use of the terms "client computing system" and "server computing system" is intended to indicate the system that generally initiates a communication and the system that generally responds to the communication. For example, a client computing system can generally initiate a communication and a server computing system generally responds to the communication. No hierarchy is implied unless explicitly stated. Both functions can be in a single communicating system or device, in which case, the client-server and server-client relationship can be viewed as peer-to-peer. Thus, if the first portable computer 802B (e.g., the client computing system) and the server computing system 804A can both initiate and respond to communications, their communications can be viewed as peer-to-peer. Additionally, the server computing systems 804A and 804B include circuitry and software enabling communication with each other across the network 820.

Any one or more of the server computing systems can be a cloud provider. A cloud provider can install and operate application software in a cloud (e.g., the network 820 such as the Internet) and cloud users can access the application software from one or more of the client computing systems. Generally, cloud users that have a cloud-based site in the cloud cannot solely manage a cloud infrastructure or platform where the application software runs. Thus, the server computing systems and organized data structures thereof can be shared resources, where each cloud user is given a certain amount of dedicated use of the shared resources. Each cloud user's cloud-based site can be given a virtual amount of dedicated space and bandwidth in the cloud. Cloud applications can be different from other applications in their scalability, which can be achieved by cloning tasks onto multiple virtual machines at run-time to meet changing work demand. Load balancers distribute the work over the set of virtual machines. This process is transparent to the cloud user, who sees only a single access point.

Cloud-based remote access can be coded to utilize a protocol, such as Hypertext Transfer Protocol ("HTTP"), to engage in a request and response cycle with an application on a client computing system such as a web-browser application resident on the client computing system. The cloud-based remote access can be accessed by a smartphone, a desktop computer, a tablet, or any other client computing systems, anytime and/or anywhere. The cloud-based remote access is coded to engage in 1) the request and response cycle from all web browser based applications, 3) the request and response cycle from a dedicated on-line server, 4) the request and response cycle directly between a native application resident on a client device and the cloud-based remote access to another client computing system, and 5) combinations of these.

In an embodiment, the server computing system 804A can include a server engine, a web page management component, a content management component, and a database management component. The server engine can perform basic processing and operating-system level tasks. The web page management component can handle creation and display or routing of web pages or screens associated with receiving and providing digital content and digital advertisements. Users (e.g., cloud users) can access one or more of the server computing systems by means of a Uniform Resource Locator ("URL") associated therewith. The content management component can handle most of the functions in the embodiments described herein. The database management component can include storage and retrieval tasks with respect to the database, queries to the database, and storage of data.

In some embodiments, a server computing system can be configured to display information in a window, a web page, or the like. An application including any program modules, applications, services, processes, and other similar software executable when executed on, for example, the server computing system 804A, can cause the server computing system 804A to display windows and user interface screens in a portion of a display screen space. With respect to a web page, for example, a user via a browser on the client computing system 802B can interact with the web page, and then supply input to the query/fields and/or service presented by the user interface screens. The web page can be served by a web server, for example, the server computing system 804A, on any Hypertext Markup Language ("HTML") or Wireless Access Protocol ("WAP") enabled client computing system (e.g., the client computing system 802B) or any equivalent thereof. The client computing system 802B can host a browser and/or a specific application to interact with the server computing system 804A. Each application has a code scripted to perform the functions that the software component is coded to carry out such as presenting fields to take details of desired information. Algorithms, routines, and engines within, for example, the server computing system 804A can take the information from the presenting fields and put that information into an appropriate storage medium such as a database (e.g., database 806A). A comparison wizard can be scripted to refer to a database and make use of such data. The applications may be hosted on, for example, the server computing system 804A and served to the specific application or browser of, for example, the client computing system 802B. The applications then serve windows or pages that allow entry of details.

Computing Systems

FIG. 7 illustrates a computing system 900 that can be, wholly or partially, part of one or more of the server or client computing devices in accordance with some embodiments. With reference to FIG. 7, components of the computing system 900 can include, but are not limited to, a processing unit 920 having one or more processing cores, a system memory 930, and a system bus 921 that couples various system components including the system memory 930 to the processing unit 920. The system bus 921 may be any of several types of bus structures selected from a memory bus or memory controller, a peripheral bus, and a local bus using any of a variety of bus architectures.

Computing system 900 typically includes a variety of computing machine-readable media. Computing machine-readable media can be any available media that can be accessed by computing system 900 and includes both volatile and nonvolatile media, and removable and non-removable media. By way of example, and not limitation, computing machine-readable media use includes storage of information, such as computer-readable instructions, data structures, other executable software or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other tangible medium which can be used to store the desired information and which can be accessed by the computing device 900. Transitory media such as wireless channels are not included in the machine-readable media. Communication media typically embody computer readable instructions, data structures, other executable software, or other transport mechanism and includes any information delivery media. As an example, some client computing systems on the network 920 of FIG. 7 might not have optical or magnetic storage.

The system memory 930 includes computer storage media in the form of volatile and/or nonvolatile memory such as read only memory (ROM) 931 and random access memory (RAM) 932. A basic input/output system 933 (BIOS) containing the basic routines that help to transfer information between elements within the computing system 900, such as during start-up, is typically stored in ROM 931. RAM 932 typically contains data and/or software that are immediately accessible to and/or presently being operated on by the processing unit 920. By way of example, and not limitation, FIG. 7 illustrates that RAM 932 can include a portion of the operating system 934, application programs 935, other executable software 936, and program data 937.

The computing system 900 can also include other removable/non-removable volatile/nonvolatile computer storage media. By way of example only, FIG. 7 illustrates a solid-state memory 941. Other removable/non-removable, volatile/nonvolatile computer storage media that can be used in the example operating environment include, but are not limited to, USB drives and devices, flash memory cards, solid state RAM, solid state ROM, and the like. The solid-state memory 941 is typically connected to the system bus 921 through a non-removable memory interface such as interface 940, and USB drive 951 is typically connected to the system bus 921 by a removable memory interface, such as interface 950.

The drives and their associated computer storage media discussed above and illustrated in FIG. 7, provide storage of computer readable instructions, data structures, other executable software and other data for the computing system 900. In FIG. 7, for example, the solid state memory 941 is illustrated for storing operating system 944, application programs 945, other executable software 946, and program data 947. Note that these components can either be the same as or different from operating system 934, application programs 935, other executable software 936, and program data 937. Operating system 944, application programs 945, other executable software 946, and program data 947 are given different numbers here to illustrate that, at a minimum, they are different copies.

A user may enter commands and information into the computing system 900 through input devices such as a keyboard, touchscreen, or software or hardware input buttons 962, a microphone 963, a pointing device and/or scrolling input component, such as a mouse, trackball or touch pad. The microphone 963 can cooperate with speech recognition software. These and other input devices are often connected to the processing unit 920 through a user input interface 960 that is coupled to the system bus 921, but can be connected by other interface and bus structures, such as a parallel port, game port, or a universal serial bus (USB). A display monitor 991 or other type of display screen device is also connected to the system bus 921 via an interface, such as a display interface 990. In addition to the monitor 991, computing devices may also include other peripheral output devices such as speakers 997, a vibrator 999, and other output devices, which may be connected through an output peripheral interface 995.

The computing system 900 can operate in a networked environment using logical connections to one or more remote computers/client devices, such as a remote computing system 980. The remote computing system 980 can a personal computer, a hand-held device, a server, a router, a network PC, a peer device or other common network node, and typically includes many or all of the elements described above relative to the computing system 900. The logical connections depicted in FIG. 7 can include a personal area network ("PAN") 972 (e.g., Bluetooth®), a local area network ("LAN") 971 (e.g., Wi-Fi), and a wide area network ("WAN") 973 (e.g., cellular network), but may also include other networks. Such networking environments are commonplace in offices, enterprise-wide computer networks, intranets and the Internet. A browser application may be resident on the computing device and stored in the memory.

When used in a LAN networking environment, the computing system 900 is connected to the LAN 971 through a network interface or adapter 970, which can be, for example, a Bluetooth® or Wi-Fi adapter. When used in a WAN networking environment (e.g., Internet), the computing system 900 typically includes some means for establishing communications over the WAN 973. With respect to mobile telecommunication technologies, for example, a radio interface, which can be internal or external, can be connected to the system bus 921 via the network interface 970, or other appropriate mechanism. In a networked environment, other software depicted relative to the computing system 900, or portions thereof, may be stored in the remote memory storage device. By way of example, and not limitation, FIG. 7 illustrates remote application programs 985 as residing on remote computing device 980. It will be appreciated that the network connections shown are examples and other means of establishing a communications link between the computing devices may be used.

As discussed, the computing system 900 can include a processor 920, a memory (e.g., ROM 931, RAM 932, etc.), a built in battery to power the computing device, an AC power input to charge the battery, a display screen, a built-in Wi-Fi circuitry to wirelessly communicate with a remote computing device connected to network.

It should be noted that the present design can be carried out on a computing system such as that described with respect to FIG. 7. However, the present design can be carried out on a server, a computing device devoted to message handling, or on a distributed system in which different portions of the present design are carried out on different parts of the distributed computing system.

Another device that may be coupled to bus 921 is a power supply such as a DC power supply (e.g., battery) or an AC adapter circuit. As discussed above, the DC power supply may be a battery, a fuel cell, or similar DC power source that needs to be recharged on a periodic basis. A wireless communication module can employ a Wireless Application Protocol to establish a wireless communication channel. The wireless communication module can implement a wireless networking standard.

In some embodiments, software used to facilitate algorithms discussed herein can be embodied onto a non-transitory machine-readable medium. A machine-readable medium includes any mechanism that stores information in a form readable by a machine (e.g., a computer). For example, a non-transitory machine-readable medium can include read only memory (ROM); random access memory (RAM); magnetic disk storage media; optical storage media; flash memory devices; Digital Versatile Disc (DVD's), EPROMs, EEPROMs, FLASH memory, magnetic or optical cards, or any type of media suitable for storing electronic instructions.

Note, an application described herein includes but is not limited to software applications, mobile apps, and programs that are part of an operating system application. Some portions of this description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. These algorithms can be written in a number of different software programming languages such as C, C+, or other similar languages. Also, an algorithm can be implemented with lines of code in software, configured logic gates in software, or a combination of both. In an embodiment, the logic consists of electronic circuits that follow the rules of Boolean Logic, software that contain patterns of instructions, or any combination of both.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

Many functions performed by electronic hardware components can be duplicated by software emulation. Thus, a software program written to accomplish those same functions can emulate the functionality of the hardware components in input-output circuitry.

While the foregoing design and embodiments thereof have been provided in considerable detail, it is not the intention of the applicant(s) for the design and embodiments provided herein to be limiting. Additional adaptations and/or modifications are possible, and, in broader aspects, these adaptations and/or modifications are also encompassed. Accordingly, departures may be made from the foregoing design and embodiments without departing from the scope afforded by the following claims, which scope is only limited by the claims when appropriately construed.

What is claimed is:

1. An apparatus, comprising:
an Artificial Intelligence ("AI") engine including plural independent processes executable by a cloud-based platform, where each independent process of the plural independent processes is configured as an independent process wrapped in a process-specific container, wherein two or more instances of an independent process of the plural independent processes are simultaneously executable to perform actions including one or more of 1) running multiple training sessions on two or more AI models at the same time, 2) creating two or more AI models at the same time, 3) running a training session on one or more AI models while creating one or more AI models at the same time, where a first service of the plural independent processes is configured to selectively add computing devices to execute additional instances of an independent process of the plural independent processes, where the plural independent processes include a watchman service configured to monitor to determine if a failure occurs in any other independent process of the plural independent processes within a training session, and responsive to such determination, to instruct another independent process within the training session to exit the training session.

2. The apparatus of claim 1, where an instructor process of the plural independent processes is configured to carry out a training plan codified in a pedagogical software programming language, and a learner process of the plural independent processes is configured to carry out an actual execution of underlying AI learning algorithms during the training session, where the instructor process and the learner process of the plural independent processes cooperate with one or more data sources to train a new AI model.

3. The apparatus of claim 2, where another process of the plural independent processes is configured to receive scripted code to create a topology of neural networks, select one or more learning algorithms, and instantiate a first AI model assigned with a unique identifier based on a description of a problem to solve codified in the pedagogical software programming language.

4. The apparatus of claim 2, where the first service is configured to direct a first CPU computing device to load and run an architect process of the plural independent processes, a second CPU computing device to load and run an instructor process of the plural independent processes, a first GPU computing device to load and run a learner process, and change an amount of computing devices running plural independent processes by dynamically calling in a third CPU computing device to load and run a second instance of the instructor process, and a second GPU computing device to load and run a second instance of the learner process.

5. The apparatus of claim 1, where a first instance of an independent process of the plural independent processes is wrapped into a corresponding software container to allow each instance of that independent process to run independently on whatever computing device that instance is running on, and where the first service is configured to dynamically change an amount of computing devices running the plural independent processes and to rapidly change the amount to scale to handle multiple users sending multiple AI models to be trained, where a second service is configured to cause the first instance of an instructor process to be instantiated, loaded onto a CPU computing device, and run on the CPU computing device.

6. The apparatus of claim 1, where the plural independent processes carry out four or more separate tasks by interaction with and cooperation between the plural independent processes, where a first task is creating a shell of an AI model, a second task is loading in a file of scripted code in a programming language to help define a topology of processing nodes in the AI model, a layout of concepts making up the AI model, and a selection of an appropriate learning algorithm for the AI model, a third task is starting to train the AI model with a data source, and a fourth task is deploying and using a trained AI model and doing predictions on data from the data source.

7. A method for an artificial intelligence ("AI") engine having plural independent processes on a cloud-based platform, comprising:
running the plural independent processes in the AI engine, where the each independent process of the plural independent processes is configured as an independent process wrapped in its own process-specific container so that multiple instances of the same processes can run simultaneously to scale to handle one or more users to perform actions selected from a group consisting of 1) running multiple training sessions on two or more AI models at the same time, 2) creating two or more AI models at the same time, 3) running a training session on one or more AI models while creating one or more AI models at the same time, and 4) any combination of these three, on the same AI engine;
running a first service of the plural independent processes to handle scaling by dynamically calling in additional computing devices to load on and run additional instances of one or more of the plural independent processes as needed; and
running a watchman service configured to determine if a failure occurs in any other independent process of the plural independent processes, and responsive to such determination, to instruct another independent process of the plural independent processes to terminate.

8. The method of claim 7, comprising:
running an instructor process of the plural independent processes, the instructor process configured to carry out a training plan codified in a pedagogical software programming language; and
running a learner process of the plural independent processes, the learner process configured to carry out an actual execution of underlying AI learning algorithms during the training session, where a first instance of the instructor process and the learner process of the plural independent processes cooperate with a first data source to train a first AI model, where a second instance of the instructor process and the learner process of the plural independent processes cooperate with a second data source to train a second AI model at the same time on the same AI engine.

9. The method of claim 8, comprising:
receiving scripted code by another process of the plural independent processes from a first client device of a first user over a network interface to create a topology of neural networks, select a learning algorithm, and instantiate the first AI model assigned with a unique identifier, and
receiving scripted code by a second process of the plural independent processes from a second client device of a second user over the network interface to run simulations on the same AI engine at the same time.

10. The method of claim 8, comprising:
running the first service to direct a first CPU computing device to load and run an architect process, a second CPU computing device to load and run the instructor process, a first GPU computing device to load and run the learner process, and change an amount of computing devices running the plural independent processes by dynamically calling in a third CPU computing device to load and run a second instance of the instructor process, and a second GPU computing device to load and run a second instance of the learner process.

11. The method of claim 7, where the plural independent processes are wrapped into a software container to allow each instance of the plural independent processes to run independently on whatever computing device that instance is running on, and where the first service is configured to dynamically change an amount of computing devices overtime running plural independent processes and to rapidly change the amount to scale to handle multiple users sending multiple AI models to be trained; and
where the plural independent processes are configured to run simultaneous instances of the plural independent processes to scale to additionally handle one or more users performing an action of deploying and using two or more trained AI models to do predictions on data from one or more data sources.

12. The method of claim 7, where the plural independent processes carry out four or more separate tasks by interaction with and cooperation between the plural independent processes; where a first task is creating a shell of an AI model; a second task is loading in a file of scripted code in a pedagogical software programming language to help define 1) a topology of processing nodes in the AI model, 2) a layout of concepts making up the AI model, and 3) a selection of an appropriate learning algorithm for the AI model; a third task is starting to train the AI model with a first data source according to a lesson plan and curriculum, and a fourth task is deploying and using a trained AI model and doing predictions on data from a second data source.

13. A method for an artificial intelligence ("AI") engine having plural independent processes on a cloud-based platform, comprising:
instantiating, on the cloud-based platform, plural independent processes, where each independent process of the plural independent processes is configured to execute in a process-specific container without other independent processes of the plural independent processes executing in the process-specific container, such that two or more different instances of an independent process of the plural independent processes are simultaneously executable within different corresponding process-specific containers;
simultaneously executing the plural independent processes on the cloud-based platform, to run a plurality of independent training sessions on a plurality of AI models;
selectively adding computing devices of the cloud-based platform to execute additional instances of an independent process of the plural independent processes; and
running a watchman service configured to determine if a failure occurs in any other independent process of the plural independent processes, and responsive to such determination, to instruct another independent process of the plurality of independent processes to terminate.

14. The method of claim 13, further comprising:
instantiating, on the cloud-based platform, an instructor process configured to carry out a training plan codified in a pedagogical software programming language; and
instantiating, on the cloud-based platform, a learner process is configured to carry out an actual execution of underlying AI learning algorithms during the training session, where the instructor process and the learner process cooperate with one or more data sources to train a new AI model.

15. The method of claim 14, wherein an independent process of the plural independent processes is configured to receive scripted code to create a topology of neural networks, select one or more learning algorithms, and instantiate a first AI model assigned with a unique identifier based on a description of a problem to solve codified in the pedagogical software programming language.

16. The method of claim 14, further comprising:
directing a first CPU computing device to load and run an instance of the architect process of the plural independent processes;
directing a second CPU computing device to load and run a first instance of the instructor process of the plural independent processes;
directing a first GPU computing device to load and run a first instance of the learner process of the plural independent processes; and
dynamically changing an amount of computing devices running the plural independent processes by dynamically calling in a third CPU computing device to load and run a second instance of the instructor process, and a second GPU computing device to load and run a second instance of the learner process.

17. The method of claim 13, further comprising dynamically changing an amount of computing devices running the plural independent processes and rapidly change the amount to scale to handle multiple users sending multiple AI models to be trained.

18. The method of claim 17, wherein the plural independent processes are configured to run simultaneous instances of an independent process of the plural independent processes to scale to additionally handle one or more users performing an action of deploying and using two or more trained AI models to do predictions on data from one or more data sources.

19. The method of claim 13, wherein the plural independent processes carry out four or more separate tasks by interaction with and cooperation between the plural independent processes, where a first task is creating a shell of an AI model; a second task is loading in a file of scripted code in a programming language to help define a topology of processing nodes in the AI model, a layout of concepts making up the AI model, and a selection of an appropriate learning algorithm for the AI model; a third task is starting to train the AI model with a data source; and a fourth task is deploying and using a trained AI model and doing predictions on data from the data source.

20. The method of claim 1, where each different independent process of the plural independent processes is configured to execute in a different corresponding process-specific container without other independent processes of the plural independent processes executing in the process-specific container.

* * * * *